(12) United States Patent
Kaiser et al.

(10) Patent No.: US 12,276,019 B2
(45) Date of Patent: Apr. 15, 2025

(54) TRANSPORT DEVICE AND METHOD

(71) Applicant: VON ARDENNE Asset GmbH & Co. KG, Dresden (DE)

(72) Inventors: Christoph Kaiser, Dresden (DE); Carsten Deus, Dresden (DE); Markus Berendt, Radeberg (DE); Matthias Smolke, Dresden (DE); Knut Barthel, Dresden (DE); Michael Hentschel, Dresden (DE)

(73) Assignee: VON ARDENNE Asset GmbH &Co. KG, Dresden (DE)

( * ) Notice: Subject to any disclaimer, the term of this patent is extended or adjusted under 35 U.S.C. 154(b) by 77 days.

(21) Appl. No.: 18/251,551

(22) PCT Filed: Oct. 7, 2021

(86) PCT No.: PCT/EP2021/077705
§ 371 (c)(1),
(2) Date: May 3, 2023

(87) PCT Pub. No.: WO2022/096218
PCT Pub. Date: May 12, 2022

(65) Prior Publication Data
US 2024/0011149 A1 Jan. 11, 2024

(30) Foreign Application Priority Data
Nov. 3, 2020 (DE) .................... 10 2020 128 928.6
Mar. 18, 2021 (DE) .................... 10 2021 106 665.4

(51) Int. Cl.
*C23C 14/56* (2006.01)
*B65G 13/04* (2006.01)
(Continued)

(52) U.S. Cl.
CPC ............ *C23C 14/562* (2013.01); *B65G 13/04* (2013.01); *B65G 21/2045* (2013.01);
(Continued)

(58) Field of Classification Search
CPC ... C23C 14/562; C23C 14/34; C23C 14/3407; C23C 14/505
See application file for complete search history.

(56) References Cited

U.S. PATENT DOCUMENTS 3,074,605 A * 1/1963 Shaw ..................... B65H 81/08
414/746.3
3,708,079 A * 1/1973 Wloszek ............... F16H 19/025
414/431
(Continued)

FOREIGN PATENT DOCUMENTS

| DE | 868574 C | 2/1953 |
| DE | 1481437 A1 | 5/1969 |

(Continued)

OTHER PUBLICATIONS

International Search Report issued for the corresponding International patent application No. PCT/EP2021/077705, dated Jan. 14, 2022, 2 pages (for informational purposes only).
(Continued)

*Primary Examiner* — James R Bidwell
(74) *Attorney, Agent, or Firm* — VIERING, JENTSCHURA & PARTNER mbB

(57) ABSTRACT

Disclosed herein are systems, methods, and devices for transporting substrates. A transport device may include a plurality of rotational bodies, where each rotational body is rotatably attached for transporting a rod-shaped workpiece. The transport device may include a rotational excitation element configured to excite rotation of the workpiece when it is supported on one of the plurality of rotational bodies.

21 Claims, 18 Drawing Sheets

(51) Int. Cl.
*B65G 21/20* (2006.01)
*B65G 27/18* (2006.01)
*C23C 14/34* (2006.01)
*C23C 14/50* (2006.01)

(52) U.S. Cl.
CPC .............. *B65G 27/18* (2013.01); *C23C 14/34* (2013.01); *C23C 14/3407* (2013.01); *C23C 14/505* (2013.01); *B65G 2201/0276* (2013.01)

(56) References Cited

U.S. PATENT DOCUMENTS

| | | | | |
|---|---|---|---|---|
| 3,713,555 | A | | 1/1973 | Wloszek |
| 3,854,614 | A | * | 12/1974 | Albrecht ................. B27B 25/02 |
| | | | | 226/177 |
| 3,970,204 | A | * | 7/1976 | Lutz ....................... B65G 13/04 |
| | | | | 198/786 |
| 4,252,039 | A | * | 2/1981 | Wittler ................... B23B 13/08 |
| | | | | 226/176 |

FOREIGN PATENT DOCUMENTS

| | | | |
|---|---|---|---|
| DE | 1957522 | A1 | 6/1970 |
| GB | 1295278 | A | 11/1972 |
| GB | 2190733 | A | 11/1987 |
| JP | S63100181 | A | 5/1988 |

OTHER PUBLICATIONS

Search Report issued for the German patent application No. 10 2021 106 665.4, dated Nov. 19, 2021, (for Informational purposes only).

\* cited by examiner

FIG. 4
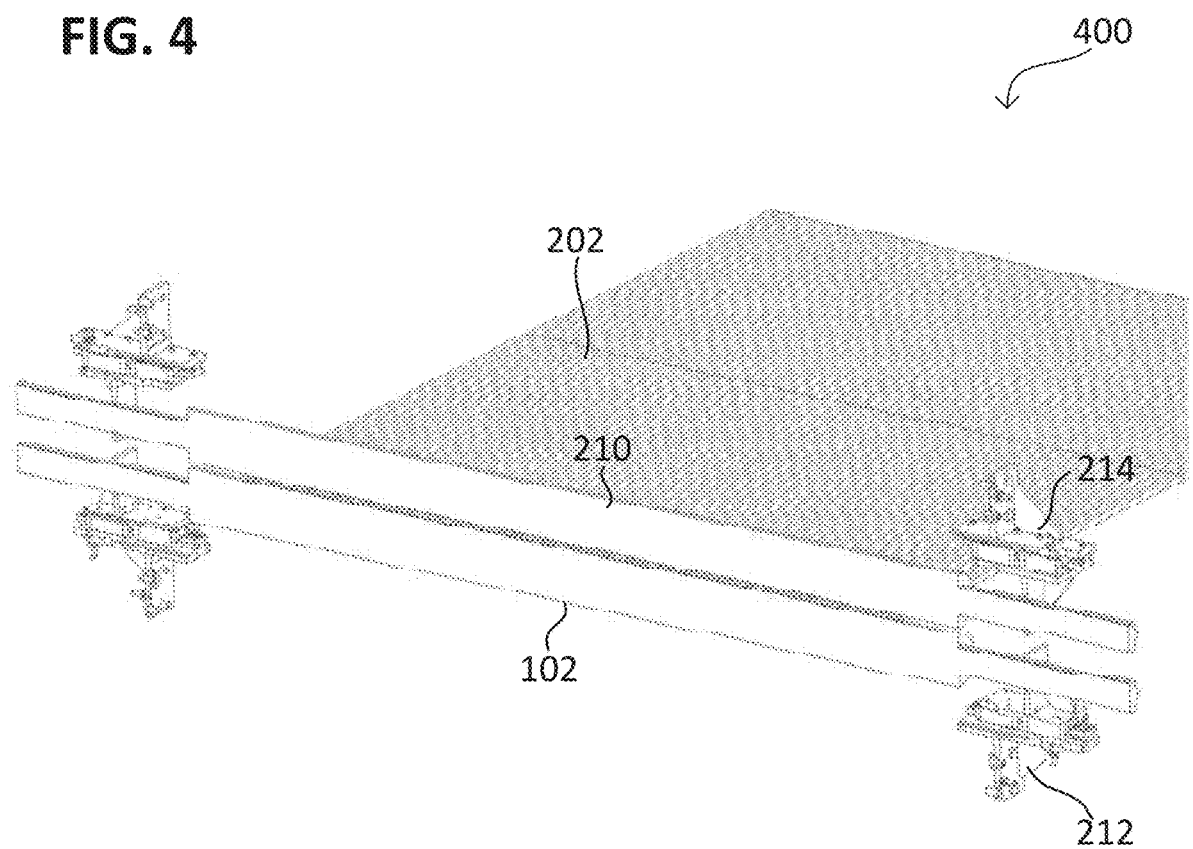
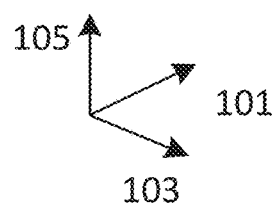

FIG. 5
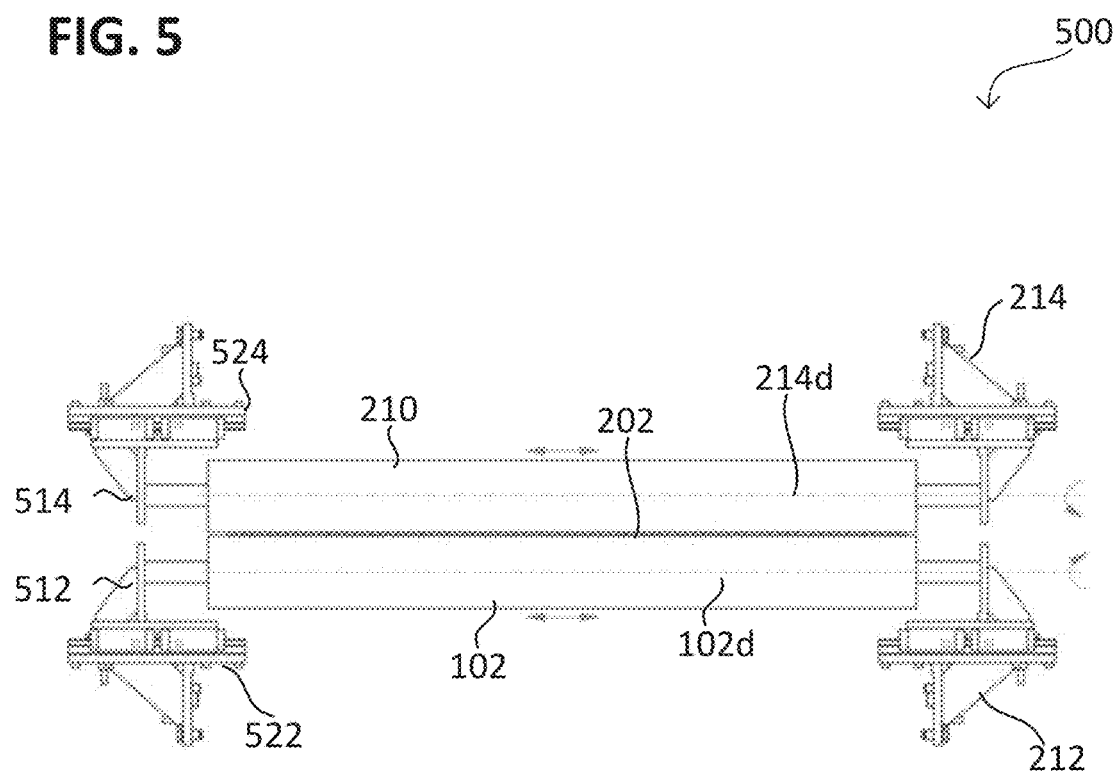
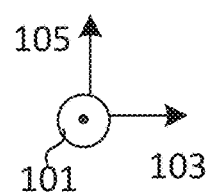

FIG. 9
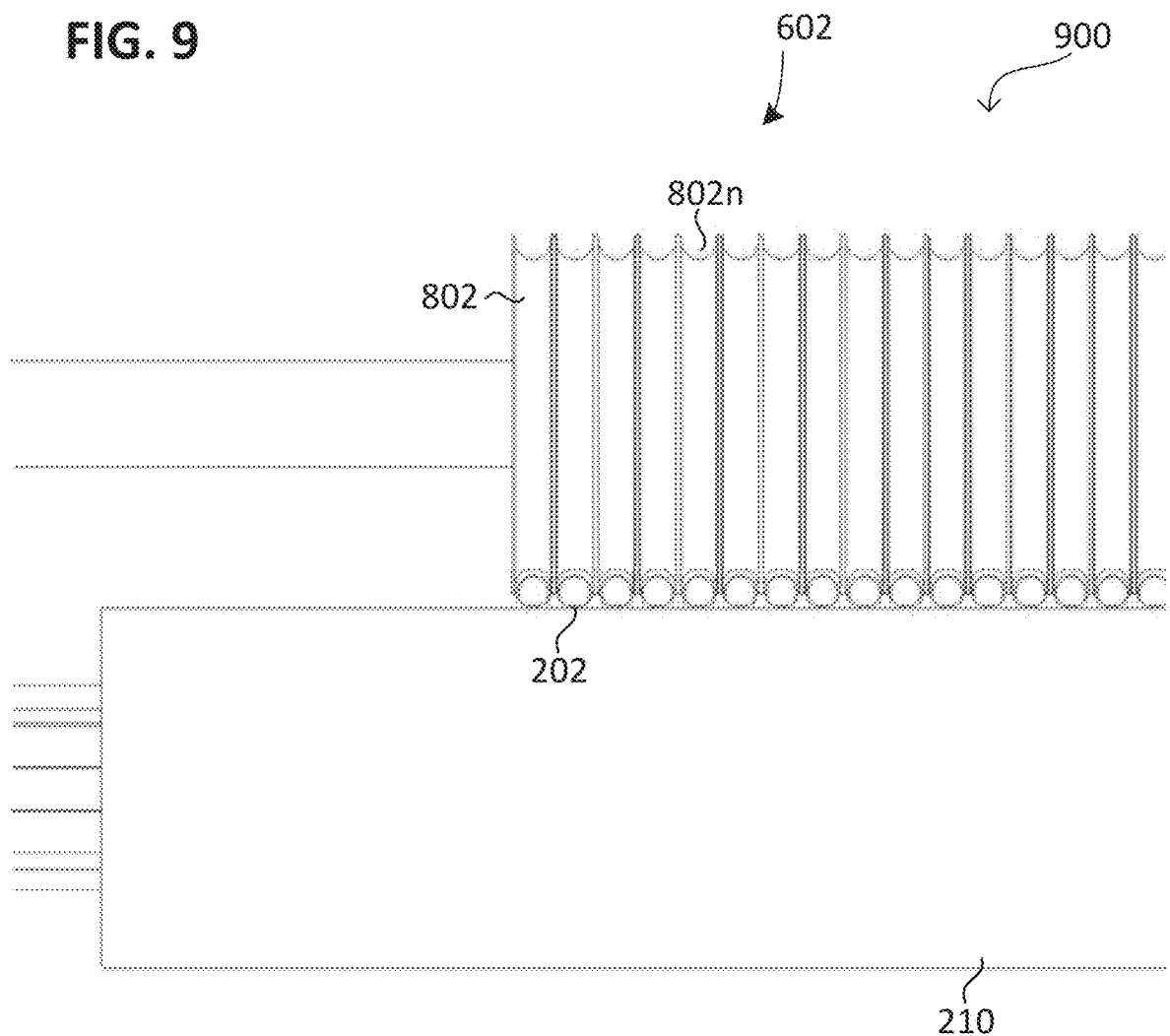
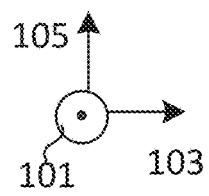

FIG. 11
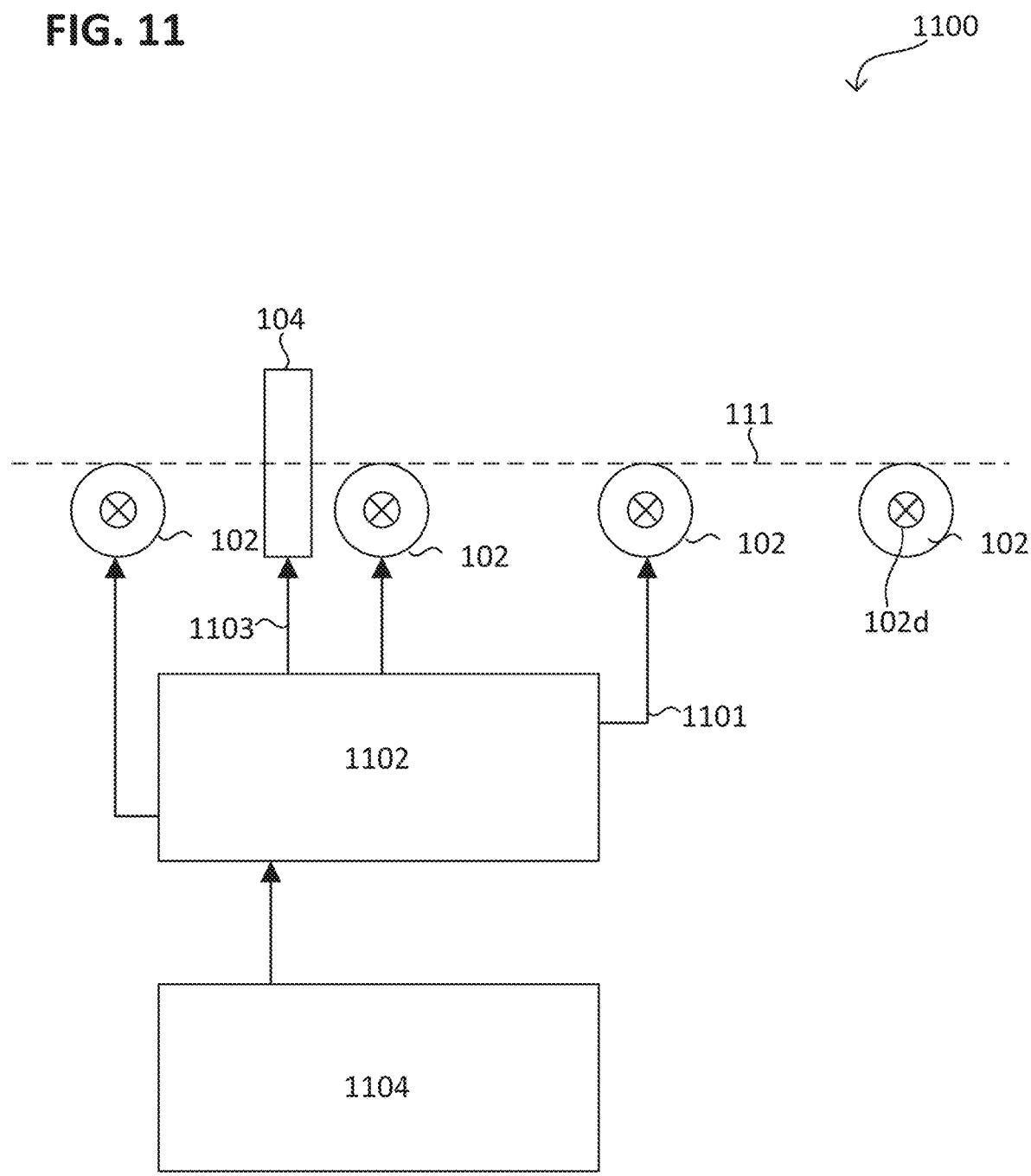
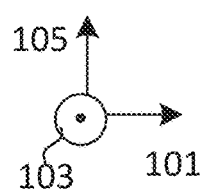

FIG. 12
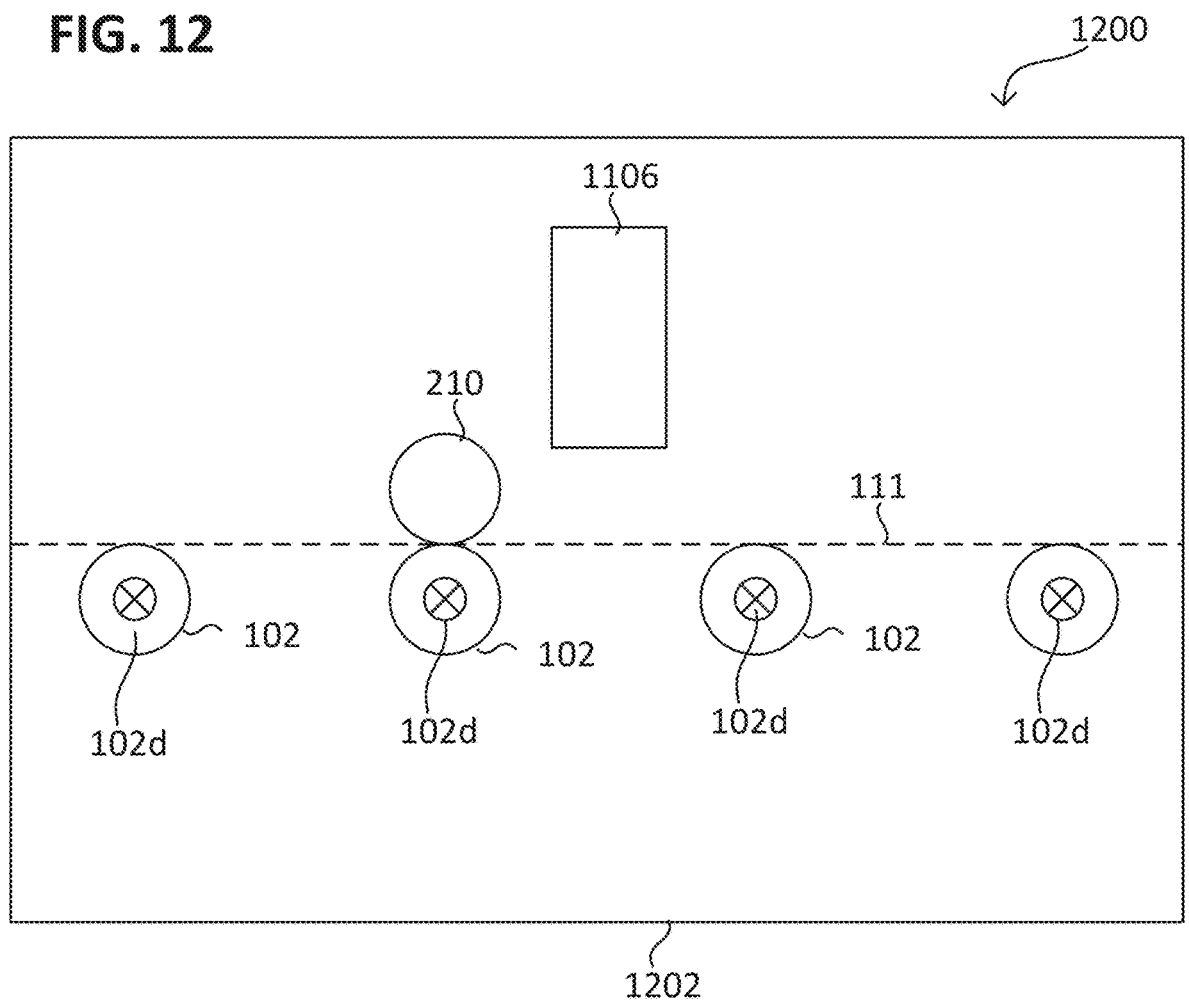
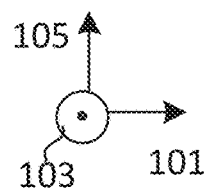

FIG. 15
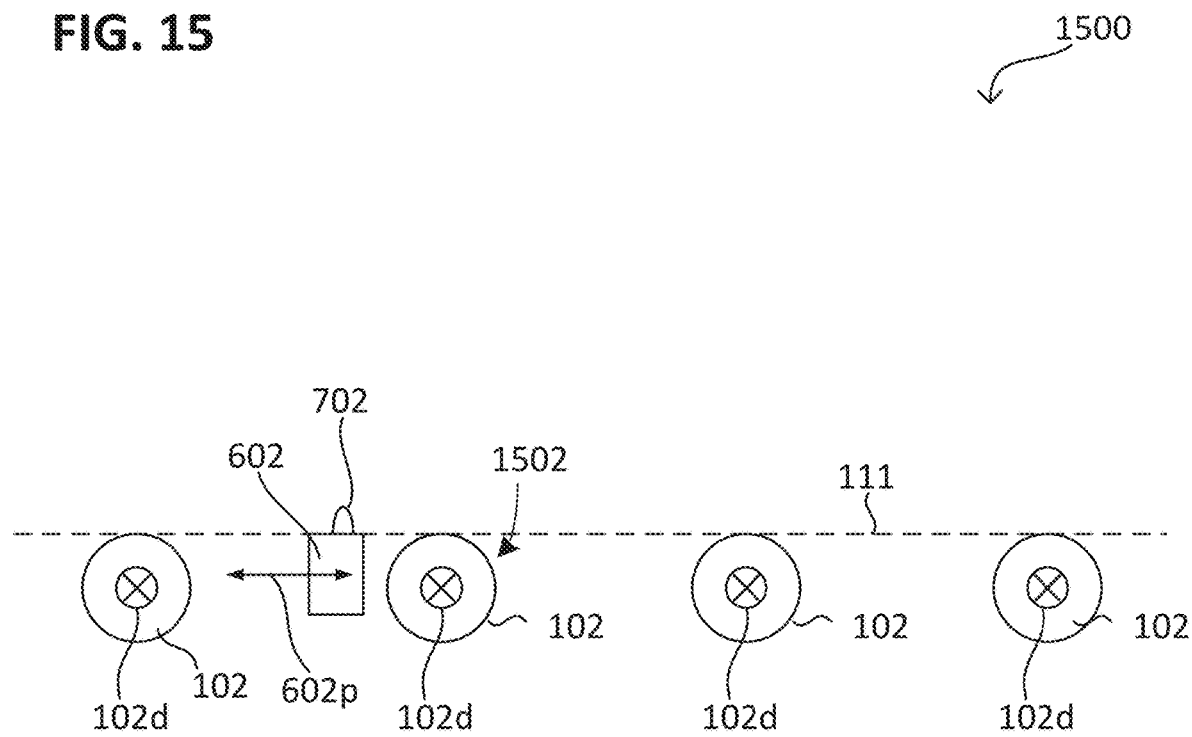
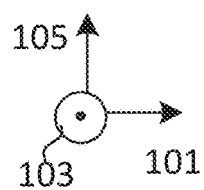

FIG. 18
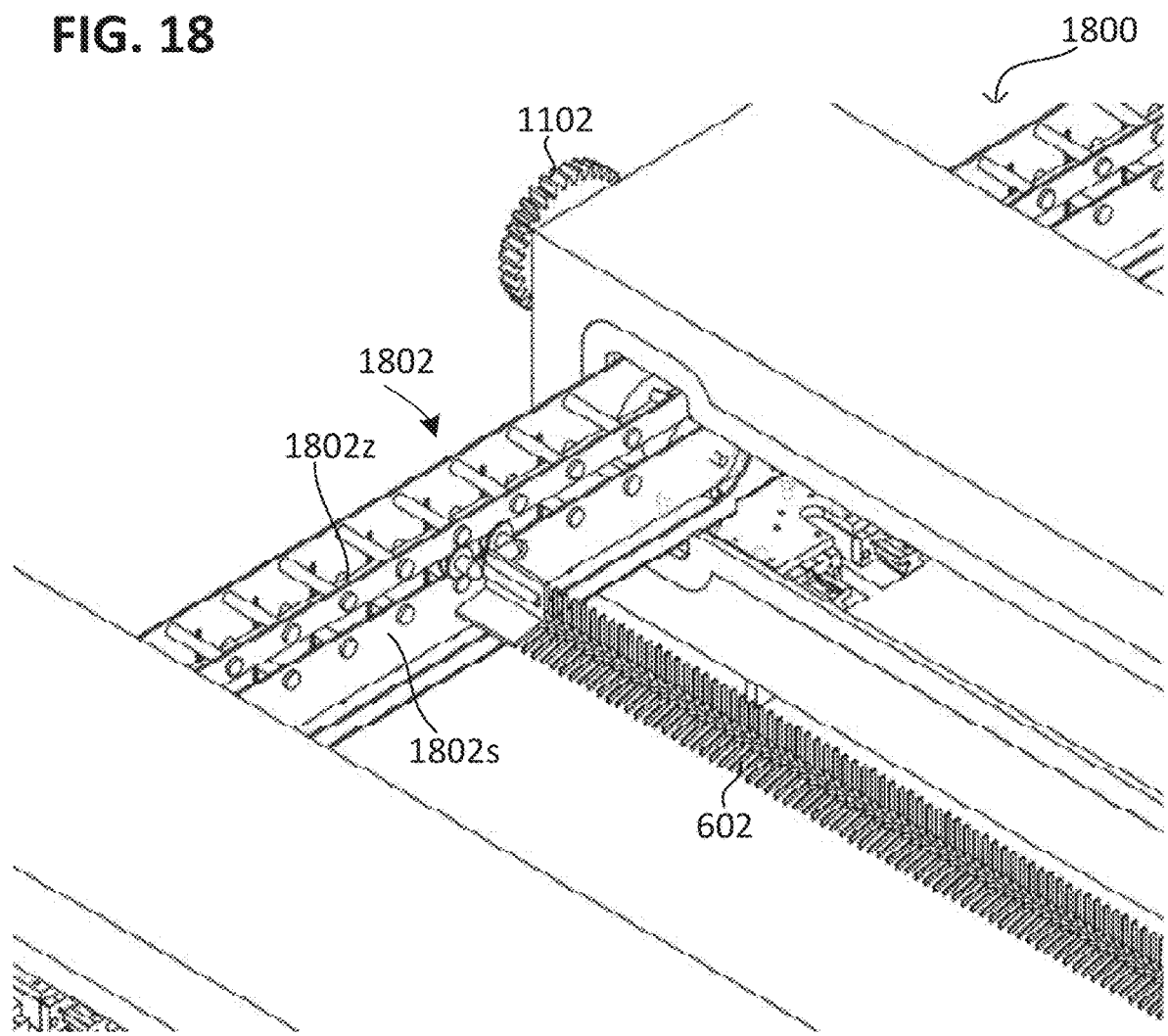
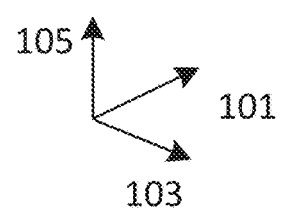

TRANSPORT DEVICE AND METHOD

CROSS-REFERENCE TO RELATED APPLICATION(S)

This application is a national phase application of PCT/EP2021/077705 filed on Oct. 7, 2021 that claims priority to DE 10 2020 128 928.6 filed on Nov. 3, 2020 and to DE 10 2021 106 665.4 filed on Mar. 18, 2021, the contents of each of which are fully incorporated herein by reference.

TECHNICAL FIELD

Various embodiments relate to a transport device and method, and in particular, for processing workpieces in a vacuum system/chamber.

BACKGROUND

In general, a workpiece, for example a pipe or other elongated workpiece, may be treated (processed), e.g. coated, so that the chemical and/or physical properties of the workpiece may be changed. Various coating processes may be performed to coat a workpiece. For example, a vacuum coating system may be used to deposit one layer or a plurality of layers on one workpiece or on a plurality of workpieces by means of a chemical and/or physical vapor deposition.

If the workpiece is to be coated on the reverse side, it is conventionally coated from several sides, leaving its position and orientation unchanged. Under certain conditions, a plurality of tubes are also attached together to a carrier, which is placed in the vacuum coating system and continuously rotates the tubes during their coating.

BRIEF SUMMARY OF THE INVENTION

According to various embodiments, a transport device and methods are provided which increase the throughput of workpieces during processing and/or make their transport gentler. Illustratively, it has been recognized that elongated workpieces are suitable to be additionally rotated about the axis of their longitudinal extension during transport along their longitudinal extension (illustratively length). For example, the workpieces are additionally stimulated to a rotational motion (also referred to as rotate) during translation along their length.

This provides that the elongated workpieces may be processed into a so-called in-line system, in which each workpiece is transported through the entire system, for example, by means of rollers (also referred to as transport rollers), whereby during the transport of the workpiece through the in-line system, a coating process may be carried out in one or plurality of areas of the in-line system.

According to various embodiments, uniform coating of tubes (also referred to as substrate tubes) as workpieces is provided in a continuous in-line system, for example, by passing (e.g., linear) coating devices (e.g., magnetrons) while simultaneously rotating the substrate tubes about their axis and translating the substrate tubes along their axis without using a traveling carrier (also referred to as a workpiece carrier).

According to various embodiments, carrier-free transport of substrate tubes along the longitudinal direction (direction of longitudinal extension) with simultaneous rotation of the tubes is provided, in particular transport through a coating line for homogeneous coating of tubes on all sides.

BRIEF DESCRIPTION OF THE DRAWINGS

In the following description, various exemplary aspects of the disclosure are described with reference to the following drawings, in which:

FIGS. 1 to 10 and 15 to 18 each show a transport device according to different embodiments in different schematic views;

FIG. 11 shows a transport system according to various embodiments in a schematic side view or cross-sectional view;

FIG. 12 shows a schematic side view or cross-sectional view of a vacuum arrangement according to various embodiments.

DESCRIPTION

Figure 1:
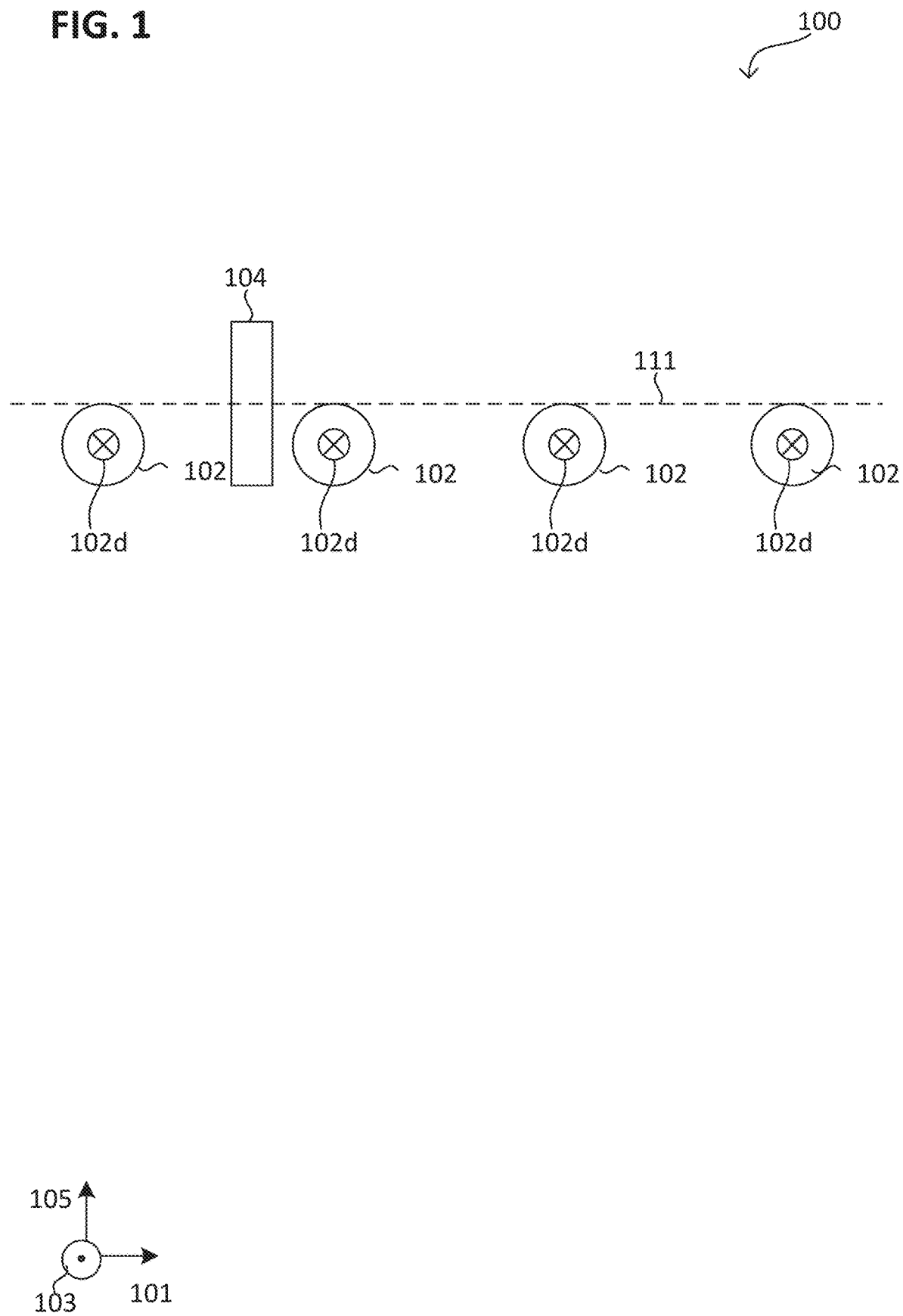

In the following detailed description, reference is made to the accompanying drawings which form part thereof and in which are shown, for illustrative purposes, specific embodiments in which the invention may be practiced. In this regard, directional terminology such as "top", "bottom", "front", "rear", "forward", "rearward", etc. is used with reference to the orientation of the figure(s) described. Since components of embodiments may be positioned in a number of different orientations, the directional terminology is for illustrative purposes and is not limiting in any way. It is understood that other embodiments may be used and structural or logical changes may be made without departing from the scope of protection of the present invention. It is understood that the features of the various exemplary embodiments described herein may be combined, unless otherwise specifically indicated. Therefore, the following detailed description is not to be construed in a limiting sense, and the scope of protection of the present invention is defined by the appended claims.

In the context of this description, the terms "connected", "attached" as well as "coupled" are used to describe both a direct and an indirect connection (e.g. ohmic and/or electrically conductive, e.g. an electrically conductive connection), a direct or indirect connection as well as a direct or indirect coupling. In the figures, identical or similar elements are given identical reference signs where appropriate.

According to various embodiments, the term "coupled" or "coupling" may be understood in the sense of a (e.g. mechanical, hydrostatic, thermal and/or electrical), e.g. direct or indirect, connection and/or interaction. For example, a plurality of elements may be coupled together along an interaction chain along which interaction may be exchanged, e.g., kinetic energy. For example, two coupled elements may exchange an interaction with each other, e.g., a mechanical, hydrostatic, thermal, and/or electrical interaction. According to various embodiments, "coupled" may be understood in the sense of a mechanical (e.g., physical or physical) coupling, e.g., by means of direct physical contact. A coupling may be configured to transmit a mechanical interaction (e.g., force, torque, etc.).

Control may be understood as the intentional influencing of a momentary state, for example the state of a system or an operation (also referred to as a process). The current state (also referred to as the actual state) may be changed in accordance with a specification (also referred to as the target state). Control may be understood as driving, where additionally a change of state is counteracted by disturbances. Illustratively, the control system may comprise a forward control path and thus illustratively implement a sequence control that converts an input variable (e.g., the target) into an output variable. However, the control path may also be part of a control loop, so that a closed-loop control is implemented. In contrast to the pure forward flow control, the closed-loop control comprises a continuous influence of the output variable on the input variable, which is impacted by the closed-loop control (also referred to as feedback). In other words, closed-loop control may be used alternatively or in addition to open-loop control, or closed-loop control may be implemented alternatively or in addition to open-loop control.

In a control system, the actual state is influenced by changing one or more than one operating parameter (then also referred to as manipulated variable) of the system or process, e.g. by means of an actuator. In a closed-loop control, the actual state is compared with the desired state and the system or process is influenced by means of a corresponding manipulated variable (using the actuator) in such a way that the deviation of the actual state from the desired state is minimized. The actual state may be ascertained based on a measurement (e.g. by means of a measuring element) of one or more than one operating parameter (then also referred to as a controlled variable).

The term "actuator" (e.g. comprising an actuator) may be understood as a converter configured to influence a state, an operation (e.g. a coating process) or a device in response to controlling the actuator. The actuator may convert a controlling signal supplied to it (by means of which controlling takes place) into mechanical movements or changes in physical variables such as pressure or temperature. For example, an electromechanical (also referred to as electromotive) actuator may be configured to convert electrical energy into mechanical energy (e.g., by movement) in response to controlling. For example, an electrical actuator may be configured to, in response to controlling, convert electrical energy into electrical energy (e.g., specific voltage, current, and/or power). An actuator may be configured (e.g., its manipulated variable) to influence the actual state (also referred to as operating point) of the process (e.g., transport process), which influence is provided by means of the actuator. The influence may be direct or indirect.

With regard to the control of an actuator, reference is made to the more easily understandable manipulated variable or its manipulated value, which is influenced by the actuator. What is described for this may apply analogously to the control variable or its control value, which is supplied to the actuator for controlling, and vice versa. Illustratively, the actuator acts as a converter which converts a control signal into the manipulated variable or its manipulated value, so that the manipulated value is a function of the control value. Modern actuators are provided, for example, as a complex assembly comprising an actuator and a dedicated control device (also referred to as an actuator control device). The actuator control device may be configured to receive the control value as input by means of the drive signal and to drive the actuator according to the control value. The generation and transmission of the control variable then takes place within the actuator, so that the controlling variable is supplied to the actuator. Less complex actuators may only process the control variable as the controlling signal, so that the control variable is fed to them for controlling.

For example, the actuator may change an electrical voltage as a manipulated variable by means of which the transport process is supplied, so that as a result a mechanical power that is supplied to a workpiece is changed. For example, the actuator may change a speed of a transport roller as a manipulated variable, so that as a result a speed of the workpiece is changed. For example, the actuator may change a torque as a controlling variable so that, as a result, an acceleration of the workpiece is changed.

Examples of components of an actuator include: a voltage source (if present), a drive train, a transmission, a motor, a clutch device, or the like. For example, the voltage source may be configured to generate and supply one or more than one voltage to the motor in accordance with the controlling. The coupling device may be configured, for example, to connect or disconnect the motor to the transport roller.

More generally, controlling an actuator may be done by means of a controlling signal, which may represent the manipulated variable or its manipulated value and/or the control variable or its control value. Alternatively or additionally, the control signal may comprise instructions indicating how the manipulated variable or its manipulated value is to be changed (e.g. its relative change).

A drive device may be understood herein as a converter configured to convert electrical energy as input to mechanical energy (e.g., kinetic energy) as output. The drive device may, for example, comprise one or more than one electromechanical converter (e.g., an actuator) and optionally one or more than one mechanical converter as a drive train. For example, the electromechanical converter may comprise an electric motor (e.g., with electric coils), such as a rotary motor or a linear motor. The electromechanical converter may comprise, for example, a compressor and a reciprocating piston coupled thereto. For example, the electromechanical converter may comprise one or more than one piezoelectric element. For example, the drive device may be configured to output the mechanical energy by means of a torque or rotational motion or by means of a linear motion.

A degree of freedom may be, for example, a translational degree of freedom or a rotational degree of freedom. Each degree of freedom may have an axis associated with it, which will be referred to in the following, e.g. with respect to a direction of the degree of freedom. The translational degree of freedom may, for example, allow linear motion (i.e., translation) along the axis. The rotational degree of freedom may, for example, allow rotational motion (i.e., rotation) about the axis.

With regard to processing (e.g. the layer-forming process), reference is made herein to so-called sputtering as an example. The term "sputtering" refers to the atomization of a material (also referred to as coating material or target material) by means of a plasma. The atomized components of the coating material (e.g. individual atoms and/or ions) are separated from each other and may be deposited onto a workpiece, for example, to form a layer. The sputtering may be performed by means of a so-called sputtering device, which may comprise one or more than one magnet system (then also referred to as magnetron). The coating material may be provided by means of a so-called sputtering target (also referred to as target for short), which may be, for example, tubular (then also referred to as tubular target) or plate-shaped (then also referred to as plate target or planar target). To generate the plasma, a voltage (also referred to as sputtering voltage) may be applied to the sputtering target (also referred to as target for short) so that the sputtering target is operated as a cathode. Even though the sputtering voltage comprises an AC voltage, the term cathode is often retained.

For sputtering, the sputtering target may be located in a vacuum processing chamber (more simply referred to as a vacuum chamber) so that sputtering may be performed in a vacuum. To this end, the environmental conditions (the process parameters) within the vacuum processing chamber (e.g., process pressure, temperature, gas composition, etc.) may be adjusted or controlled during sputtering. For example, a working gas may be or may be provided within the vacuum processing chamber, denoting the plasma-forming gas or the plasma-forming gas mixture. For example, the vacuum processing chamber may be or may be configured to be air-tight, dust-tight, and/or vacuum-tight such that a gas atmosphere having a predefined composition (also referred to as a working atmosphere) or pressure (also referred to as a working pressure or process pressure) may be provided within the vacuum processing chamber (e.g., according to a set point). The vacuum chamber may be configured such that a vacuum (i.e., a pressure less than 0.3 bar) and/or a pressure in a range of about 1 mbar to about 10-3 mbar (in other words, fine vacuum) or less may be provided therein, e.g. a pressure in a range of about 10-3 mbar to about 10-7 mbar (in other words high vacuum) or less may be or may be provided, e.g. a pressure of less than high vacuum, e.g. less than about 10-7 mbar (in other words ultra high vacuum) may be or may be provided. The lowest pressure that may be provided in the vacuum chamber is also referred to as the residual vacuum.

According to various embodiments, reference is made to physical vapor deposition (PVD) as an exemplary coating process, e.g. comprising a sputtering process, which is to be distinguished from chemical vapor deposition (CVD). In contrast to CVD, in PVD a solid material is first transferred to the gas phase (also referred to as gaseous phase or vapor) and a layer is formed by means of this gas phase. The gaseous phase of the target material in PVD may optionally be chemically reacted with a reactive gas to form a chemical compound, which is incorporated into or forms the layer. Thus, in the chemical reaction of PVD, two or more materials are combined to form the chemical compound. In the chemical vapor deposition, a gaseous starting compound (also referred to as precursor or reactant) is split into at least two reaction products, of which at least one reaction product is incorporated into the layer and optionally one reaction product is removed from the coating process as excess (e.g., by means of a pump). Optionally, the CVD may be carried out by means of a plasma in which the cleavage of the precursor takes place.

A plasma may be formed by means of a so-called working gas (also referred to as a plasma-forming gas). According to various embodiments, the working gas may comprise a gaseous material which is inert, in other words which participates in few or no chemical reactions. For example, a working gas may be or become defined by and adapted to the target material used. For example, a working gas may comprise a gas or gas mixture that does not react with the target material to form a solid or is even inert to it. For example, the working gas may comprise a noble gas (e.g., helium, neon, argon, krypton, xenon, radon) or a plurality of noble gases. The plasma may be formed from the working gas, which, for example, essentially causes the target material to be atomized.

It may be understood that what is described herein for sputtering may apply by analogy to any other process (e.g., coating process), such as physical vapor deposition. In general, physical vapor deposition (e.g., sputtering) comprises transferring the chemical composition of the target or coating material into the layer being formed. Examples of processing include: additive processing (e.g., coating), subtractive processing (e.g., etching), thermal processing (e.g., cooling and/or heating), transformative processing, irradiative processing (e.g., exposure), transformative processing (e.g., chemical conversion), and so forth.

Exemplary implementations of the transport device according to various embodiments comprise a transport device arranged stationary (i.e., stationary) along the transport direction, comprising:

a transport roller which is rotatably attached around its own axis (also referred to as the axis of rotation) and is driven, for example;

that the workpieces rest, for example, on the transport roller (which is arranged below the transport surface, for example);

an optional guide device, with a plurality of lateral guide elements, guides the workpieces each separately in a corridor bounded on both sides (also referred to as a track);

that the transport device drives a linear transport (also called workpiece translation) of the workpieces along their longitudinal extension (e.g. along the tube axis) (by rotation of the transport roller and/or a roller-like guide device about its axis);

in that the transport device may excite or drive rotation of the workpieces about their axis (e.g. by means of a change in relative lateral displacement between a transport roller and the guide device);

in that the transport device may optionally be driven in accordance with a plurality of transport processes (workpiece translation and/or workpiece rotation) simultaneously or independently of one another;

optionally a device for raising and lowering the transport roller and/or the guide device (by means of which these may be moved towards or away from the transport surface);

in that a second transport roller is optionally arranged above the transport surface opposite the transport roller, which second transport roller may also be moved laterally along its axis, the workpieces being arranged in an intermediate space between the upper and lower transport rollers and optionally being fixed by the latter under certain clamping pressure (in this case, for example, rotation of the workpieces may be driven by means of opposing lateral displacement of the upper and lower transport rollers); and/or in that the transport roller and/or the guide device are mounted so as to be laterally movable along a direction transverse to the transport direction of the workpieces and are coupled to a drive device which may dynamically adjust a lateral displacement between transport roller and guide device in a controlled manner.

Exemplary examples of the guide device comprise:

a comb-like contour, with the guide elements (e.g. like tines of the comb) projecting between or laterally next to the workpieces, thus limiting the lateral displacement of the workpieces;

a comb roller, e.g. comprising a roller with a plurality of disc-like guide elements projecting between or next to the workpieces, the comb roller optionally being coupled to a rotary drive;

a ball bed guide, e.g. comprising balls rotatably attached underneath the transport surface, each between the workpieces to be transported; and/or a comb roller arranged above the transport surface, whereby, for example, rotation of the workpiece is facilitated during feed of the workpieces.

For example, the guide device and/or the transport roller may each be provided as a comb roller. A roller with threads (also referred to as a threaded roller) may be used to stimulate rotation of the workpiece. Thereby, rotation of the workpiece is facilitated when the workpiece is advanced (also referred to as workpiece translation).

According to various embodiments, the guide device may comprise a so-called guide comb. A guide comb generally comprises a plurality of tines, e.g. rod tines (then also referred to as rod comb) or disc tines (also referred to as plate tines). A recess (also referred to as a workpiece-receiving recess) may be arranged between each two directly adjacent tines, in which the workpiece may be or is received. The workpiece receiving recess may be annular, for example (e.g. in the case of a circumferential groove). Each of the workpiece receiving recesses may optionally extend through the transport surface into the guide device. This provides that the workpieces do not necessarily rest on the bottom of the workpiece receiving recess, which provides a particularly gentle transport (at least with low abrasion) of the workpieces, for example sparing their surface or coating.

The drive device for the workpiece translation (e.g. translation of the substrate tubes) by means of a rotation of the transport rollers and the workpiece rotation (e.g. rotation of the of the substrate tubes) by means of an axial displacement between transport roller and guide device may be controllable and/or adjustable independently of each other.

The transport device may be configured to transport a plurality of workpieces at the same time, which may be a small distance from each other.

The workpiece rotation may be oscillating, for example by means of an oscillation of the relative displacement between transport roller and the guide device.

The oscillation angle of the rotation of the substrate tubes may be adjusted by the selected amplitude of the oscillation of the lateral displacement between the transport roller and the guide device. Adjusted amplitudes may also be used for different diameters of the substrate tubes.

The workpiece rotation may optionally take place by means of a constant direction of rotation, if synchronously to an oscillating lateral displacement between transport roller and guide device an also oscillating horizontal displacement between transport roller and guide device takes place, so that the transport roller is in contact with the substrate tubes during the first half oscillation of the lateral displacement in a first direction, but is not in contact with the substrate tubes during the second partial oscillation in the other direction.

In order to promote homogeneous coating along the circumference of the workpiece, different motion sequences may optionally be stored for the workpieces, e.g. an oscillating revolution with an amplitude of 360°, but also a motion sequence with shifting of the reversal points to different angular positions during successive oscillations.

A plurality of support devices of the transport device are arranged along the equipment transport direction, each support device comprising a transport roller, a rotational excitation element and/or a guide device. At least one coating device may be arranged between two support devices.

Alternatively or in addition to a coating process, one or more than one pretreatment process or one or more than one other treatment process is also possible.

Optionally, a bias voltage (illustratively a voltage different from electrical ground) may be applied to the workpiece during transport. For this purpose, for example, the transport roller and/or the guide device and/or a contact element of the transport device may comprise an electrically conductive surface which is insulated from the electrical mass (e.g. chamber mass) and is coupled to a bias voltage supply.

According to various embodiments, it may be provided that the substrates in the coating area have no contact with the transport system (e.g. may be transported without contact). This avoids interference (e.g. tracks) when coating the substrate.

FIG. 1 illustrates a transport device 100 according to various embodiments in a schematic side view or cross-sectional view (looking in the direction of transport 101). The transport device 100 comprises: a plurality of first transport rollers 102 (also referred to as workpiece translation transport rollers or, for short, WT transport rollers), each transport roller being rotatably attached about an axis of rotation 102*d*. The axes of rotation 102*d* may be parallel to each other, parallel to a transverse direction 103, and/or transverse to the direction of transport 101, for example. The plurality of WT transport rollers 102 may, for example, be adjacent to a transport surface 111 that is parallel to the transport direction 101 (also referred to as the equipment transport direction in the context of a coating system) and parallel to the axes of rotation 102*d*. By means of the WT transport rollers 102, transporting of the workpiece along the transport direction 101 (also referred to as workpiece translation) may be provided, e.g., driven.

The WT transport rollers 102 may, for example, comprise a cylindrical rotational body (then also referred to as a cylindrical roller) having an outer surface adjacent to the transport surface 111. What is given for cylindrical rotational bodies may apply by analogy to differently shaped rotational bodies (e.g., spheres, comb rollers, or the like) that are adapted to the shape of the workpieces, for example.

The transport device 100 further comprises a rotation excitation device 104 configured to excite rotation (also referred to as rotational motion or workpiece rotation) of a workpiece (not shown) as it rests on the plurality of transport rollers 102. The workpiece may be rod-shaped. To excite the rotational motion, the rotational excitation device 104 may comprise a kinematic chain, the last link of which (also referred to as the rotational excitation element) is in contact (i.e., physical contact) with the transporting workpiece. By means of the rotational excitation element, motion supplied along the kinematic chain may be imparted to the workpiece such that the workpiece is imparted rotational motion (also referred to as workpiece rotation).

The rod-shaped workpiece may comprise a longitudinal extent (illustratively length) greater (e.g., two times, five times, or ten times) than its circumference (also referred to as workpiece circumference), e.g., the circumference of a cross-sectional area of the workpiece that is transverse to the longitudinal extent. For example, the cross-sectional area may comprise a circular contour or circumference. For example, the workpiece may comprise the outer surface of a circular cylinder. Optionally, the workpiece may be hollow on the inside (then also referred to as a hollow body), e.g., tubular.

For example, the workpiece may comprise a length of more than about 1 m (meter), e.g., more than about 2 m, e.g., more than about 3 m, e.g., in a range of about 3 m to about 5 m. For example, the workpiece may comprise a circumference of less than about 1 m (meter), e.g., less than about 0.5 m, e.g., less than about 0.25 m. For example, the workpiece may comprise a diameter of less than about 0.2 m (meters), e.g., less than about 0.15 m, e.g., less than about 0.10 m, and/or in a range of about 8 cm (centimeters) to about 15 cm.

Examples of the rod-shaped workpiece comprise: a rod, a strut, a tube, a cylinder or the like.

Several exemplary implementations of the transport device 100 are explained below. Reference is made to an exemplary rotational excitation element comprising a transport roller (also referred to as a WR transport roller). What is described for the WR transport roller may apply by analogy to other implementations of the rotational excitation element (e.g., comprising a threaded roller).

Figure 2:
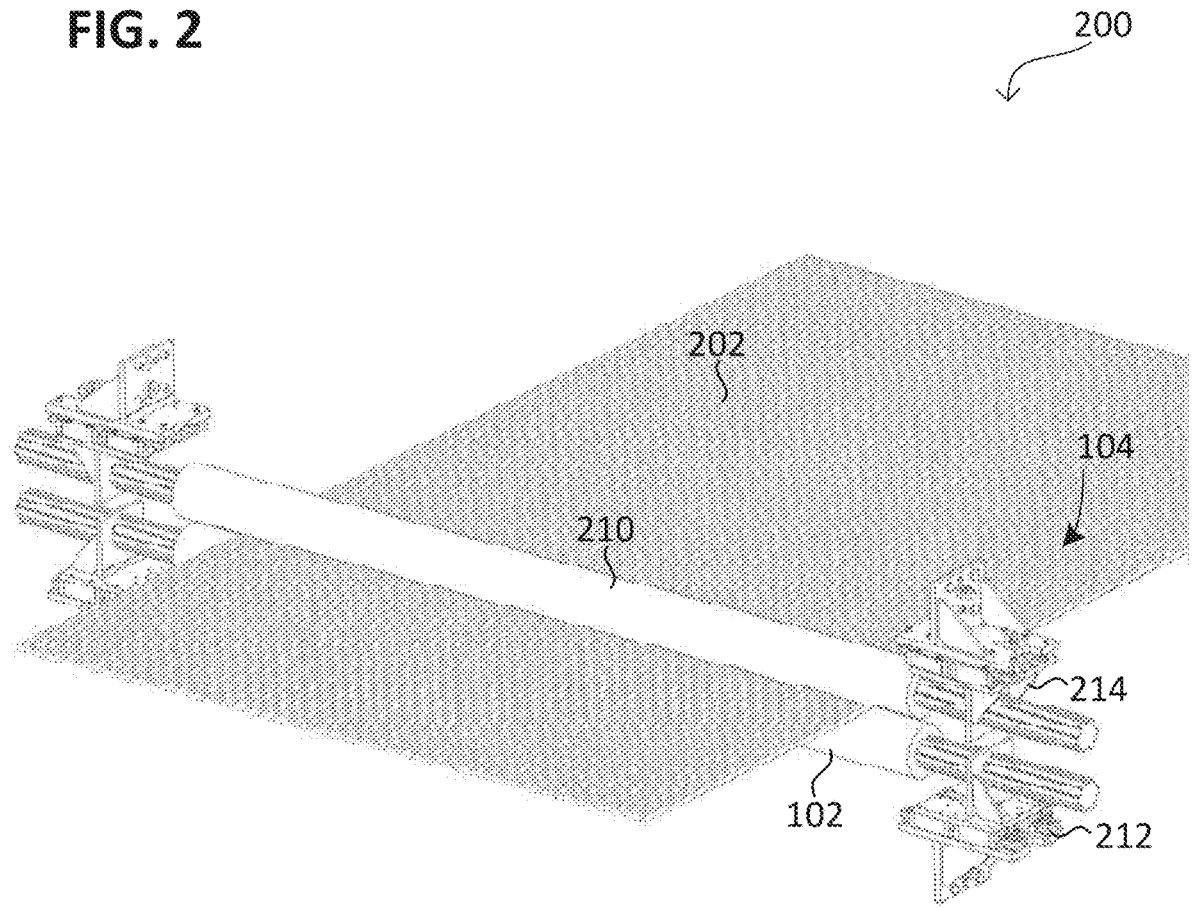

FIG. 2 illustrates a transport device 100 according to various embodiments 200 in a schematic perspective view (looking at the transport surface). The rotational excitation device 104 may comprise a transport roller 210 (also referred to as a workpiece rotational transport roller, or WR transport roller for short) as the rotational excitation element 210. The WR transport roller 210 and a WT transport roller 102 of the transport device 100 (also referred to as a pair of transport rollers) may be directly opposite each other, forming a gap therebetween through which the transport material may be transported. The transported material may comprise one or more than one workpiece, for example, a plurality of workpieces transported side by side.

The transport device 100 may comprise a first bearing device 212 (e.g., comprising at least one pivot bearing) by means of which the WT transport roller 102 may be rotatably mounted (about the first axis of rotation 102*d*).

The rotational excitation device 104 may comprise a second bearing device 214. The second bearing device 214 may comprise a rotatably attached bearing by means of which the WR transport roller 210 may be rotatably attached (about a second 214*d* axis of rotation). The second bearing device 214 may further comprise a linear bearing (e.g., comprising one or more than one guide rail) by means of which the WR transport roller 210 may be moveably supported, e.g., along its axis of rotation 214*d* and/or along the transverse direction 103. By means of moving the WR transport roller 210 along its axis of rotation and/or along the transverse direction 103 (also referred to as displacing), its position relative to the WT transport roller 102 may be changed. This may transmit torque to one or more than one workpiece 202 contacted by the WR transport roller 210. As a result, the or each workpiece 202 contacted by the WR transport roller 210 may be rolled on the WT transport roller 102 or transport surface 111 along the second axis of rotation or in or against the transverse direction 103.

More generally, the displacing may comprise changing the relative position of the WR transport roller 210 and the WT transport roller 102 with respect to the axis of rotation 214*d*, such that this may be displaced laterally with respect to each other or their displacement with respect to each other may be changed (e.g., increased and/or decreased). For example, the displacement may be zero when the WR transport roller 210 and the WT transport roller 102 are each arranged in their initial positions.

Optionally, the first bearing device 212 may comprise a linear bearing (e.g., comprising one or more than one guide rail) by means of which the WT transport roller 102 may be moveably supported. This provides that the WT transport roller 102 may be displaced alternatively or in addition to the WR transport roller 210. For example, if these are each displaced in opposition to each other, it may be provided that the workpieces remain better in their track during the workpiece rotation (also referred to as tracking or track keeping). Each workpiece may be associated with a track, wherein the tracks are arranged side by side, and wherein each track indicates the area (illustratively a corridor) in which the workpiece associated with the track is to be transported.

The displacement of the WR transport roller 210 and/or the WT transport roller 102 may be driven by means of a drive device 1102 (see FIG. 11). For example, one or more than one sequence (also referred to as a motion sequence) may be or may be stored according to which the displacing may occur. The one or more than one motion sequence may, for example, be stored in a storage medium (e.g., a control device). The control device may actuate a drive device according to the motion sequence, which drive device is coupled to the transport device and is configured, for example, to supply mechanical energy (also referred to as kinetic energy) to the transport device.

For example, WR transport roller 210 may be coupled to drive device 1102 configured to cause the displacement.

Herein, reference is made to a drive apparatus comprising a first drive train (e.g., comprising a motor and/or transmission) configured to drive the displacing, and a second drive train (e.g., comprising a motor and/or transmission) configured to drive the rotational motion of the WT transport roll 102. By analogy, what is described for the two separate drive trains may apply to a drive device comprising only one motor, the movement of which is caused by a gearbox that drives both the displacing and the rotational motion of the WT transport roller 102.

Optionally, the first drive train and/or the second drive train may be controllable, e.g. by controlling a motor of the respective drive train (e.g. so that its speed may be changed) and/or by controlling the transmission of the respective drive train (e.g. so that its transmission ratio may be changed). The transmission may couple the motor to the transport device.

Figure 3:
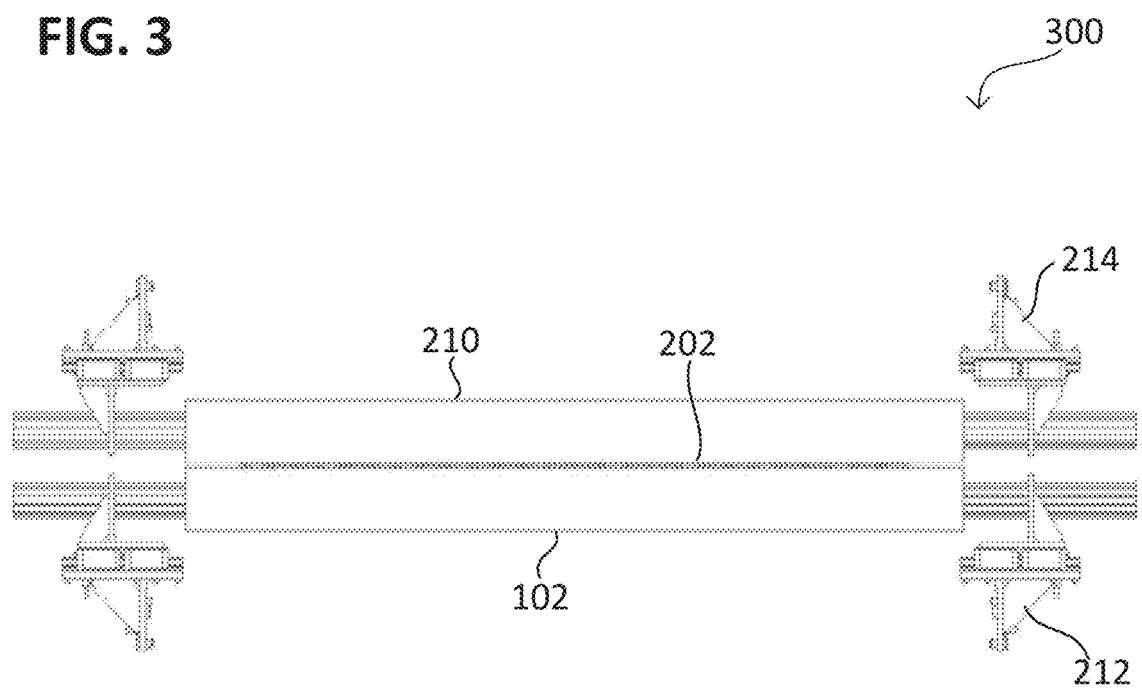

FIG. 3 illustrates a transport device 100 according to various embodiments 300 in a schematic side view or cross-sectional view (looking from the transport direction 101). For example, the workpieces 202 may be clamped between two cylindrical rollers, a first cylindrical roller of which provides the WT transport roller 102 and a second cylindrical roller of which provides the rotational excitation element 210. Optionally, the transport device 300 may comprise a guide device (also referred to as a track-limiting device), as described in more detail below. The guide device may be configured to block or at least limit a degree of freedom of the or each workpiece in the transverse direction. Illustratively, this encourages the workpiece to remain in its assigned track.

FIG. 4 illustrates a transport device 100 according to various embodiments 400 in a schematic cutaway perspective view (looking at the transport surface). A plurality of workpieces may be or become clamped between the two cylindrical rollers simultaneously.

FIG. 5 illustrates a transport device 100 according to various embodiments 500 in a schematic side view or cross-sectional view (looking from the transport direction 101).

The first bearing device 212 may comprise a first rotatably attached bearing 512, by means of which the WT transport roller 102 may be rotatably attached (about a first axis of rotation 102*d*). The first bearing device 212 may further comprise a first linear bearing 522 (e.g. comprising one or more than one guide rail), by means of which the first rotary bearing 512 may be moveably supported, e.g. along the first axis of rotation 102*d*.

The second bearing device 214 may comprise a second rotatably attached bearing 514, by means of which the WR transport roller 210 may be rotatably attached (about a second axis of rotation 214$d$). The second bearing device 214 may comprise a second linear bearing 524 (e.g. comprising one or more than one guide rail), by means of which the second rotary bearing 514 may be moveably mounted, e.g. along the second axis of rotation 214$d$.

The displacement of the WR transport roller 210 and the displacement of the WT transport roller 102 may optionally be coupled to each other, e.g. mechanically by means of a gearbox and/or electrically by means of the control device (see FIG. 11). The displacement of the WR transport roller 210 and the rotation of the WT transport roller 102 may optionally be coupled to each other, e.g. mechanically by means of a gearbox and/or electrically by means of the control device (not shown).

Figure 6:
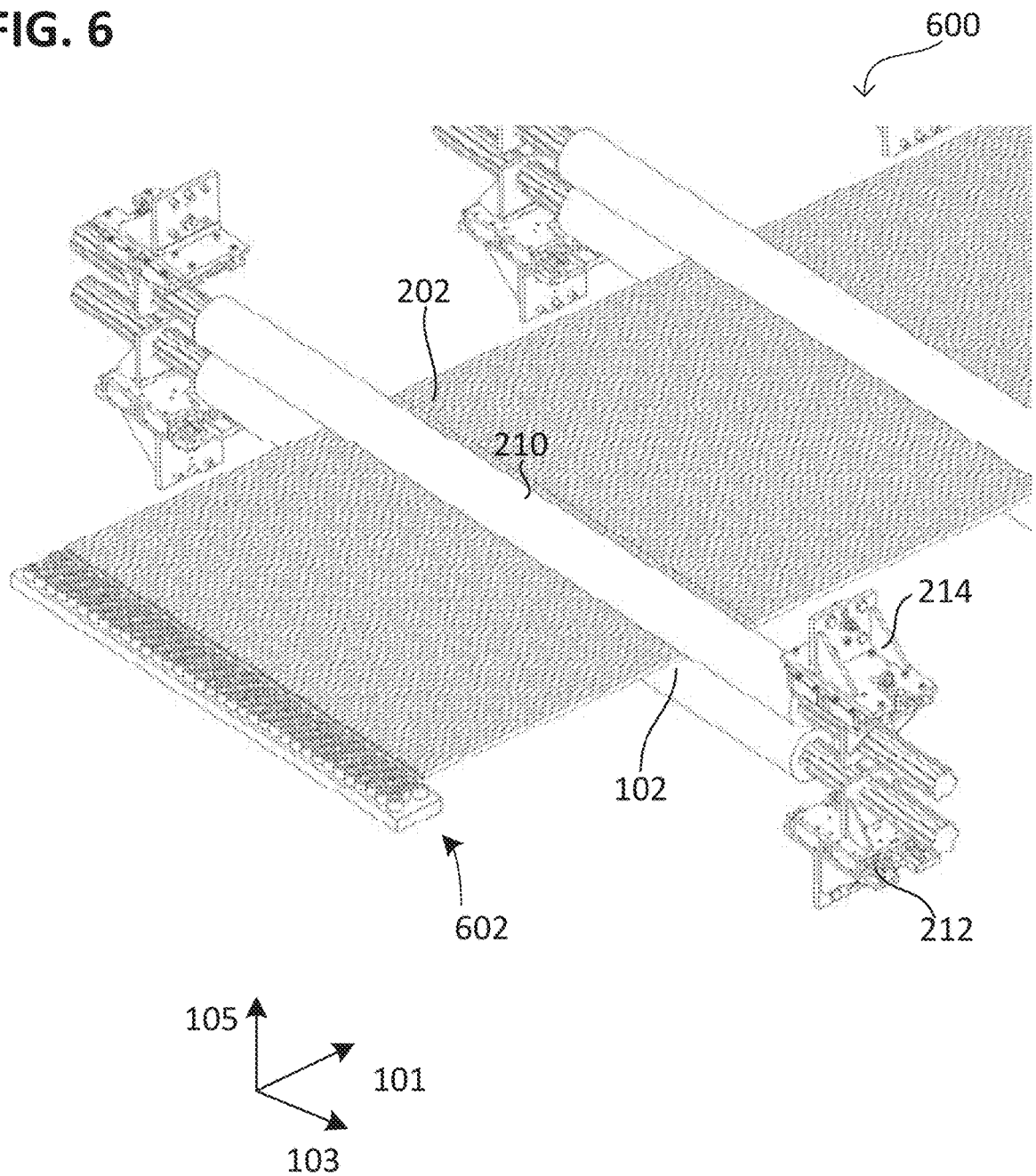

FIG. 6 illustrates a transport device 100 according to various embodiments 600 in a schematic perspective view (looking at the transport surface), in which the transport device 100 further comprises a guide device 602 (also referred to as a track guide device). The guide device 602 may comprise a plurality of track limiters, with a track disposed between two track limiters. The guide device 602 may facilitate tracking of the workpieces 202.

Figure 7:
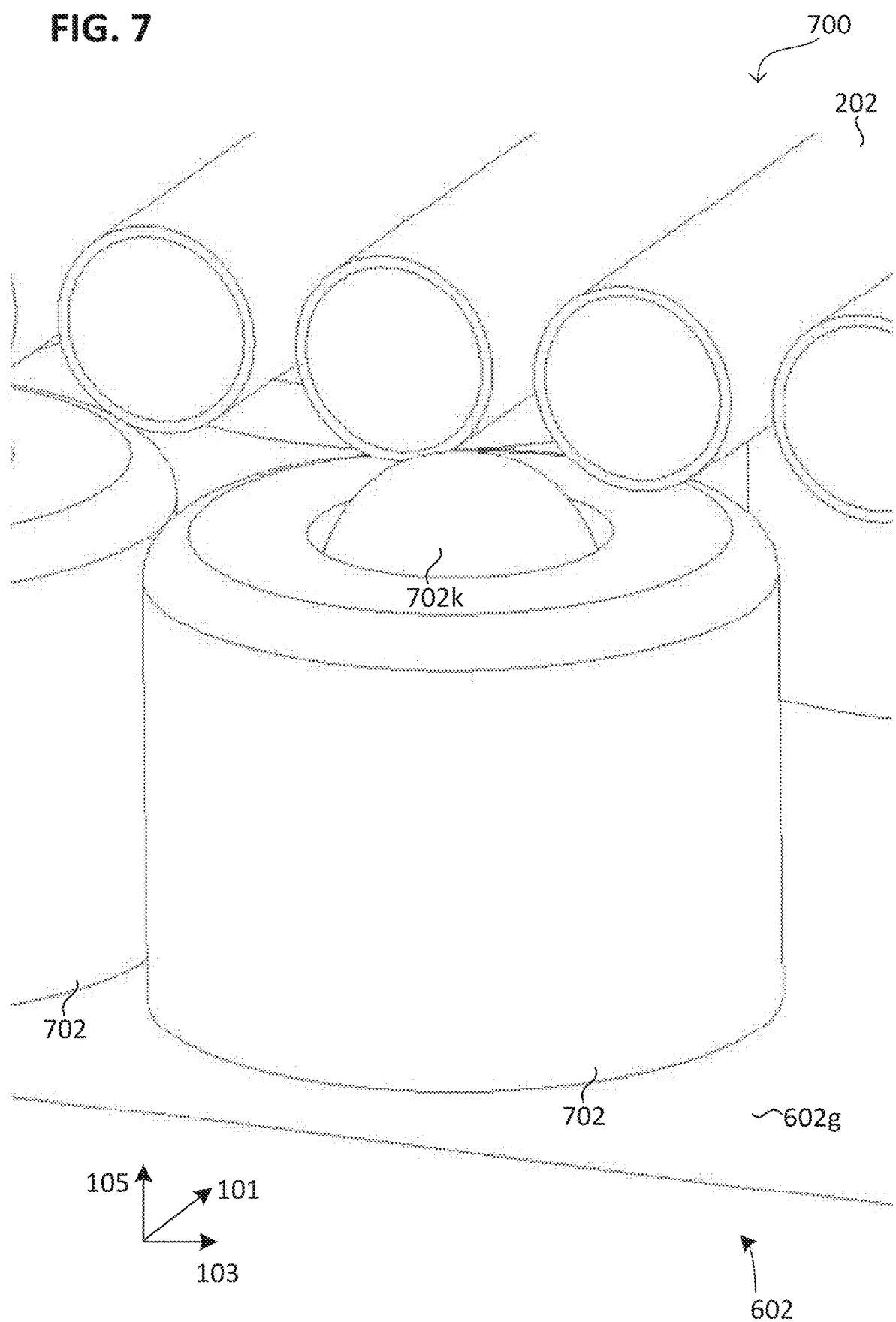

FIG. 7 illustrates a transport device 100 according to various embodiments 700 in a schematic perspective view (looking at the transport surface), in which the transport device 100 comprises the guide device 602 (also referred to as a track guide device) whose track limiters 702 (also referred to as guide elements) are implemented by means of balls 702$k$. For example, each track limiter 702 may comprise one or more than one ball 702$k$ extending through the transport surface. This provides that the workpieces 202 may be guided laterally by means of the balls and, if desired, may rest on the balls 702$k$ (i.e., are also supported in a vertical direction). The balls provide a particularly gentle transport (at least with low abrasion) of the workpieces, for example protecting their surface or coating.

In an exemplary implementation of the guide device 602, a base frame 602$g$ may be provided that holds the plurality of balls 702$k$ (also referred to as a roller table).

In accordance with embodiments 700, the rotational excitation element (e.g., the WR transport roller 210) may have the guide device 602 directly opposite it, e.g., as an alternative to or in addition to the WT transport roller 102. For example, if the opposite guide device 602 is used instead of the opposite WT transport roller 102, the infrastructure to relocate it (e.g., the second linear bearing and/or associated parts of the drive device) may be saved, simplifying the design.

For example, the workpieces 202 may be clamped between a cylindrical roller and a roller table, of which the cylindrical roller provides the rotational excitation element 210 and the roller table provides the track limiters 702. Movement of the cylindrical roller in the axial direction 103 (also referred to as the transverse direction 103) may drive workpiece rotation of the workpieces (e.g., resting on the roller table).

Figure 8:
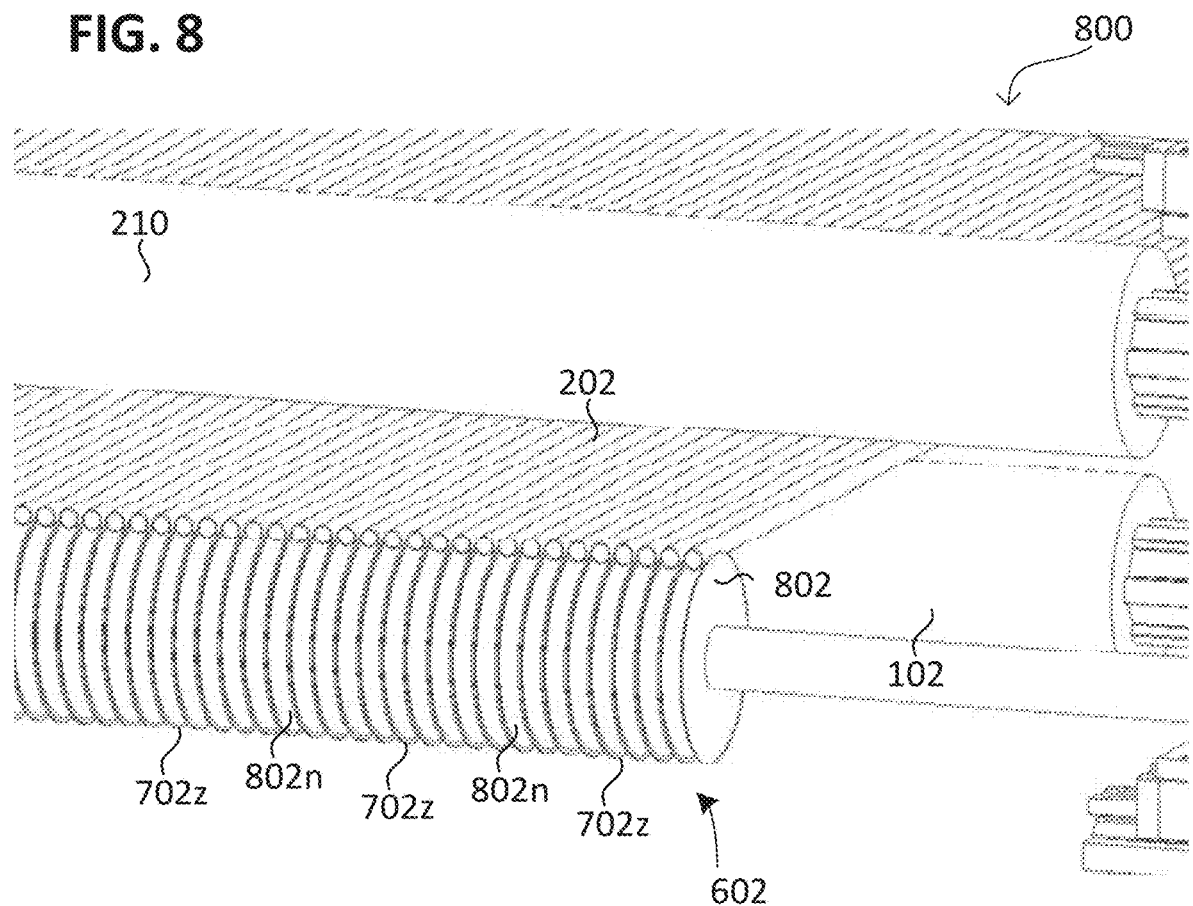

FIG. 8 illustrates a transport device 100 according to various embodiments 800 in a schematic perspective view (looking at the transport surface), in which the transport device 100 comprises the guide device 602 (also referred to as a track guide device) implemented by means of a so-called comb roller 802. The comb roller may comprise a plurality of circumferential projections 702$z$ (the so-called tines, for example in the form of discs, which are also referred to as disc tines) as track limiters, each tine 702$z$ extending through the transport surface 111. This provides that the workpieces 202 are guided laterally by means of the tines 702$z$. The tines 702$z$ (e.g., two immediately adjacent to each other) may each define a circumferential groove 802$n$ as a workpiece receiving recess, with a groove 802$n$ being disposed between each two tines 702$z$. Each of the grooves 802$n$ may extend through the transport surface 111 into the comb roller 802. This provides that the workpieces 202 do not necessarily rest on the bottom of the grooves 802$n$ (then also referred to as guide roller 802 or guide roller 802), which provides a particularly gentle transport (at least with low abrasion) of the workpieces, for example protecting their surface or coating.

The guide roller 802 is configured, for example, in such a way that the workpieces 202 have a distance from the bottom of the grooves 802$n$ during transport (then also referred to as guide roller 802 or guide roller). For this purpose, the grooves 802$n$ may be configured in such a way that the bottom of the grooves 802$n$ has a corresponding distance from the transport surface 111. In general, such a guide roller 802 may be arranged on top or on the bottom.

FIG. 9 illustrates a transport device 100 according to various embodiments 900 in a schematic perspective view (looking from the transport direction 101), in which the rotational excitation element 210 (e.g., the WR transport roller 210) and the guide device 602 (e.g., its comb roller 802) are directly opposite each other so that a gap is formed between them.

For example, the grooves 802$n$ may extend (e.g., up to the transport surface 111) into the comb roller 802. Optionally, the comb roller 802 may be configured such that the bottom of the grooves is curved and/or contacts the transport surface 111 or the workpieces 202. This facilitates workpiece rotation. In this configuration, the displacement of the bottom WR transport roller 210 may occur, for example, only when workpiece translation occurs, which facilitates the workpiece rotation. This condition may be implemented, for example, by means of a motion sequence.

For example, the workpieces 202 may be clamped between a cylindrical roller and a comb roller, of which the cylindrical roller provides the rotational excitation element 210 and the comb roller provides the track limiters 702. Movement of the cylindrical roller in the axial direction 103 (also referred to as the transverse direction 103) may drive the workpiece rotation.

According to embodiments 900, the top comb roller 802 may also be configured as a guide roller 802 (also referred to as top guide roller 802), for example, such that the workpieces 202 have a distance from the bottom of the grooves 802$n$ during transport. For this purpose, the grooves 802$n$ may be configured such that the bottom of the grooves 802$n$ has a corresponding distance from the transport surface 111. If the top comb roller 802 (illustratively a roller) is configured as a guide roller 802 and contacts the substrates (e.g., tubes), e.g., only laterally, both rotation and translation may be performed. This embodiment is similar to embodiments 800 (see FIG. 8) with the difference that the axis of rotation of the comb roller 802 is arranged above the transport surface 111.

Figure 10:
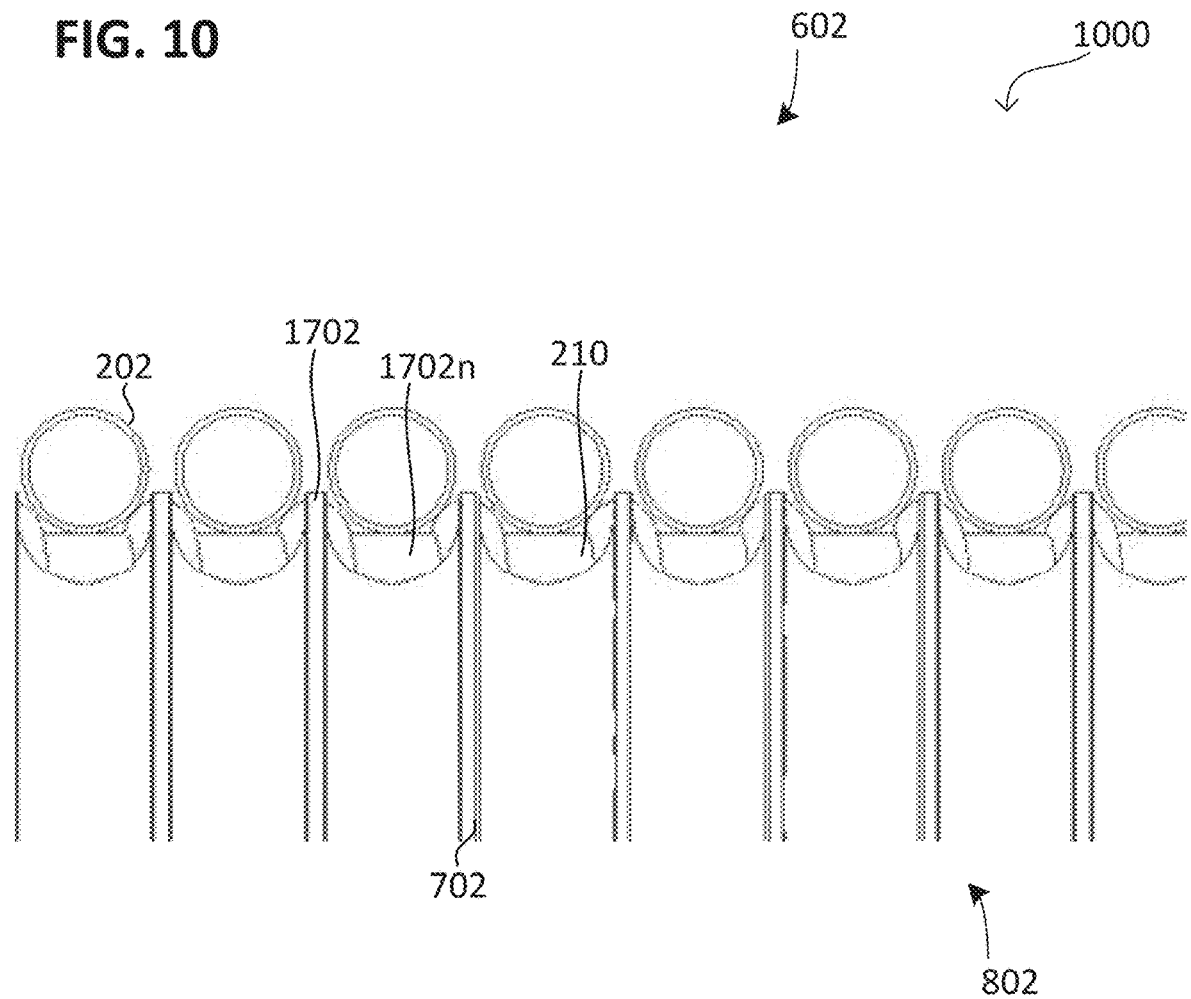

FIG. 10 illustrates a transport device 100 according to various embodiments 1000 in a schematic side view (looking from the transport direction 101), in which the rotational excitation element 210 (e.g., the WR transport roller 210) and the guide device 602 (e.g., its comb roller 802) are arranged one after the other along the transport direction 101, e.g., below the transport surface 111.

The WR transport roller 210 may comprise a helical (running along a helix), multiply-circumferential groove

1702n (then also referred to as a threaded groove) (then also referred to as a threaded roller) in which the plurality of tracks are disposed.

The thread roller 210 may further comprise a multiply-circumferential projection 1702z (the so-called spiral wall) as track limiters, which extends through the transport surface 111. This provides that the workpieces 202 are laterally guided by means of the helical wall 1702z. The helical wall 1702z may respectively delimit the circumferential thread 1702n, wherein the thread 1702n is respectively arranged between two sections of the helical wall 1702z. The thread 1702n may extend into the WR transport roller 210 up to the transport surface 111. This provides that the workpiece 202 rests on the bottom of the threaded passage 1702n, which facilitates workpiece rotation.

Displacing may comprise simultaneously moving the threaded roller 210 in the transverse direction 103 starting from an initial position of its rotational motion, moving it away from the transport surface 111 after one revolution until the threaded roller 210 is positioned below the transport surface 111 (and the workpieces 202 hang freely), and then moving it back to the initial position. This movement may be along a closed path, for example, comprising two sections leading toward and away from the transport surface, respectively, and interconnected by two sections extending parallel to the transport surface.

For example, in this configuration, the displacement of the WR transport roller 210 may occur only when the workpiece translation occurs, which facilitates the workpiece rotation. This condition may be implemented, for example, by means of a motion sequence.

FIG. 11 illustrates a transport system 1100 according to various embodiments in a schematic side view or cross-sectional view (looking in the transport direction 101), comprising the transport device 100 and the drive device 1102.

The drive device 1102 is configured to supply kinetic energy 1101 to the plurality of WT transport rollers 102 (e.g., each of the transport rollers), for example, by means of a first rotational motion. The first rotational motion may be generated, for example, by means of a first motor.

The drive device 1102 is further configured to supply kinetic energy 1103 to the rotational excitation device 104 (e.g., the rotational excitation element thereof), for example, by means of a motion (also referred to as a transverse displacement motion). The transverse displacement motion may be, for example, a second rotational motion. The second rotational motion may be generated, for example, by means of the first motor or by means of a second motor. Alternatively or in addition to the second rotary motion, the transverse displacement motion may also be a linear motion, for example generated by means of a linear motor.

The drive device 1102 may be controlled by means of a control device, e.g., according to one or more than one motion sequence, exemplary implementations of which are explained below.

A first exemplary motion sequence may be implemented, whereby controlling the drive device 1102 is based on a diameter of the WR transport roller 210 and/or the WT transport roller 102.

Two second exemplary motion sequences may differ from each other in the generated transverse displacement motion, e.g., in a duration of the transverse displacement motion, an amplitude of the transverse displacement motion, a velocity of the transverse displacement motion, a frequency or timing of the transverse displacement motion, and/or a direction of the transverse displacement motion. Of course, other parameters of the transverse displacement motion may also be affected by the difference.

A third exemplary motion sequence may be implemented, whereby the transverse displacement motion (e.g., its duration, amplitude, velocity, frequency, etc.) is based on a rotational speed of the WT transport roller 102 and/or a speed of the workpiece translation (also referred to as transport speed).

A fourth exemplary motion sequence may be implemented, whereby the transverse displacement motion (e.g., its duration, speed, frequency, etc.) is based on a diameter of one or more than one workpiece.

A fifth exemplary motion sequence may be implemented, whereby workpiece rotation of a workpiece occurs such that the workpiece remains within one track of a plurality of tracks. For example, the track may comprise an extent along the transverse direction that is greater than a diameter of the workpiece and/or is less than the circumference of the workpiece and/or is less than twice the diameter of the workpiece.

A sixth exemplary motion sequence may be implemented, whereby the workpiece rotation of a workpiece is based on the workpiece translation, e.g., a speed and/or a rate of the workpiece translation.

FIG. 12 illustrates a vacuum arrangement 1200 according to various embodiments in a schematic side view or cross-sectional view (looking in the transport direction 101), which comprises the transport device 100. The vacuum arrangement 1200 may comprise a vacuum chamber 1202 in which the WT transport rollers 102 and/or the rotational excitation element 210 are disposed. Further, the vacuum arrangement 1200 may comprise a coating device 1106 (e.g., a sputtering device) configured to emit a coating material toward the transport surface 111. The coating material may be, for example, gaseous. The coating material may be generated, for example, by atomization or thermal vaporization.

Figure 13:
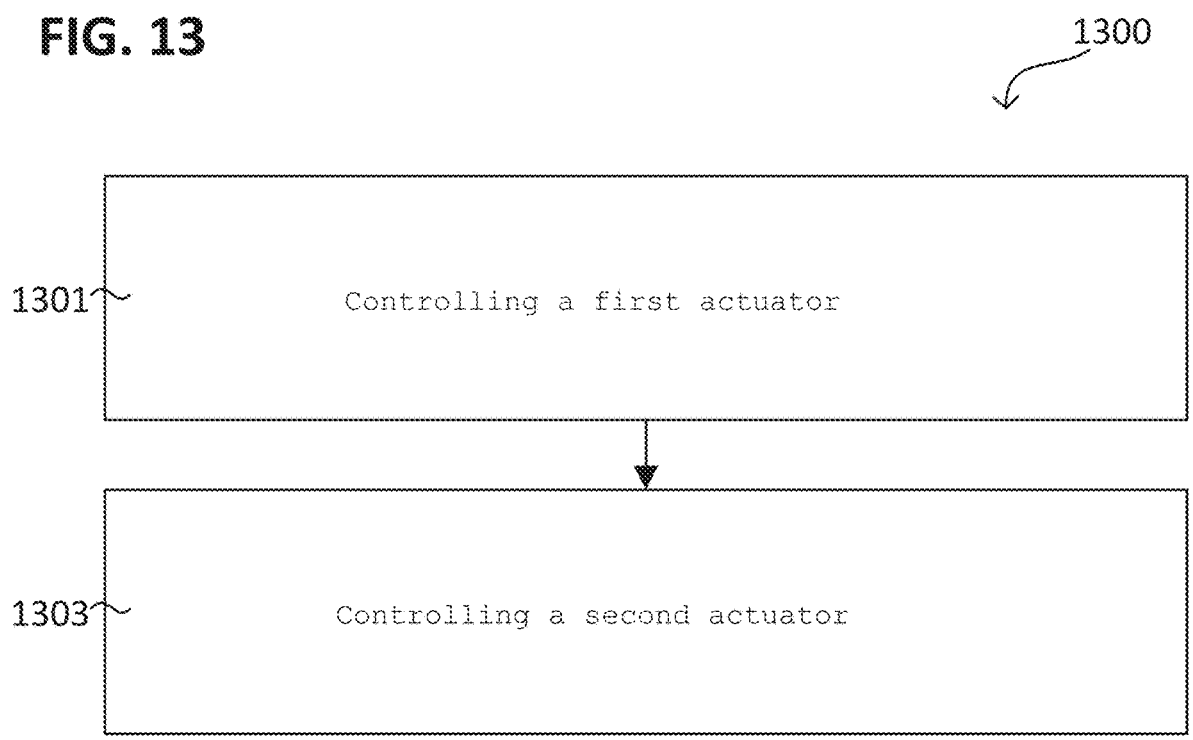
FIGS. 13 and 14 each show a process according to different embodiments in a schematic flow chart.

FIG. 13 illustrates a method 1300 (e.g., for controlling the transport device) according to various embodiments in a schematic flowchart. The method 1300 comprises, in 1301, controlling a first actuator (e.g., a first motor and/or a first gear) by means of which a first motion (e.g., the first rotational motion) is imparted to the transport device 100 such that one or more than one of the WT transport rollers 102 of the transport device 100 are caused to rotate about its rotational axis 102d. The method 1300 comprises, in 1303, controlling a second actuator (e.g., a second motor and/or a second gear) by means of which a second motion (e.g., the second rotational motion and/or the linear motion) is supplied to the transport device 100 such that a rotational excitation element of the transport device 100 is caused to move along the transverse direction 103.

The method may be or may be implemented using code segments and/or using the control device 1104.

Optionally, controlling the second actuator may be performed according to a motion sequence selected, for example, from a plurality of stored motion sequences.

Figure 14:
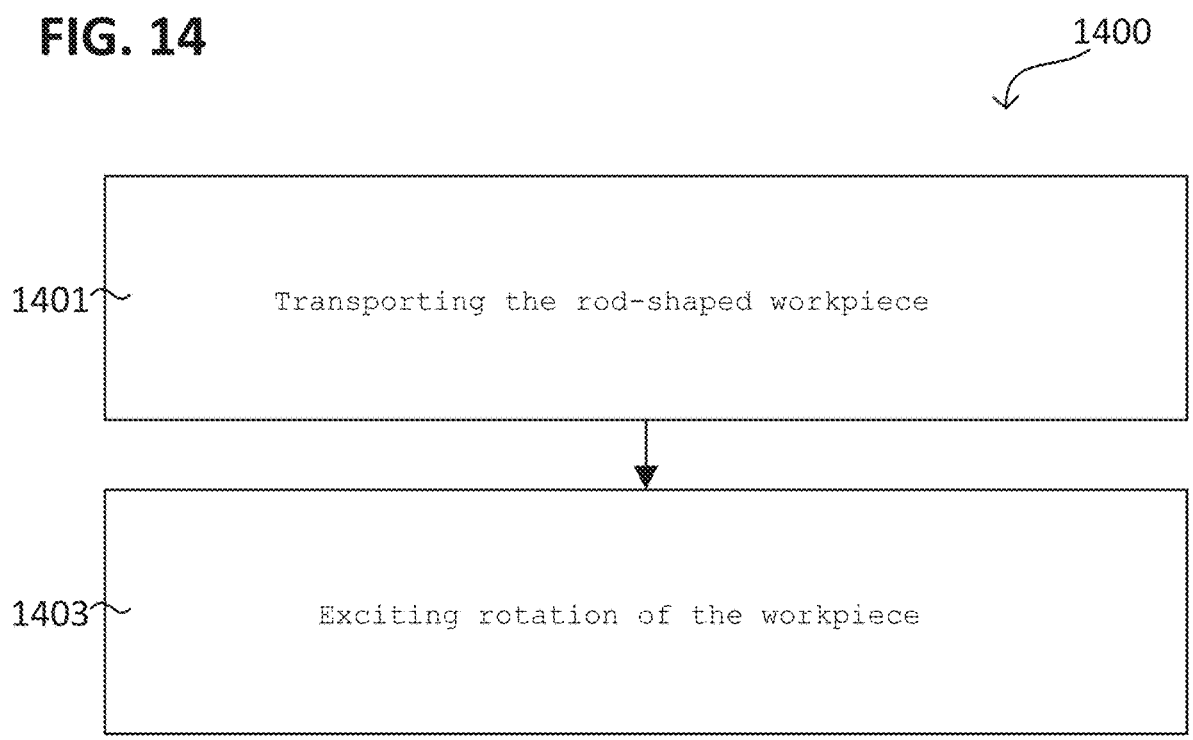

FIG. 14 illustrates a method 1400 (e.g., for operating the transport device) according to various embodiments in a schematic flowchart. The method 1400 comprises, in 1401, transporting the rod-shaped workpiece along a transport direction by means of a plurality of transport rollers on which the workpiece rests. The method 1400 comprises, in 1403, exciting rotation of the workpiece about an axis of rotation that is along the transport direction by means of a rotational excitation device or rotational excitation element thereof when the workpiece is supported on the plurality of transport rollers, for example, when (or before or after) the workpiece is moved along the transport direction. Transporting 1401 may be performed by means of energizing the first actuator. Exciting 1403 rotation of the workpiece may be performed by controlling the second actuator.

According to various embodiments, the workpiece may rest on at least three WT transport rollers 102.

FIG. 15 illustrates a transport device 100 according to various embodiments 1500 in a schematic side view (looking from the transport direction 101), which may be configured according to any of embodiments 100 to 1000, for example, and further comprising a movably mounted guide device 602. This reduces friction between the guide device 602 and the workpiece. For example, the guide device 602 may be brought to the speed at which the workpieces are transported (also referred to as the transport speed) and moved along with them.

For example, the guide device 602 may be movable, e.g., moveably, mounted in the transport direction 101 and/or along a path 602 (also referred to as a movement path 602).

Preferably, the movement path 602*p* may be self-contained and/or comprise or be formed from at least one rectilinear section (also referred to as a guide section) that is along the transport direction 101. The self-contained movement path 602*p* facilitates returning the guide device 602 to its waiting position. For example, a guide device 602 moved along a self-contained path 602*p* may be moved cyclically, at a constant speed, and/or at a constant timing. For example, the guide section may be along the transport surface 111.

The guide device 602 may be supported, or the path of movement 602*p* may be arranged, such that each of the plurality of guide members 702 (e.g., provided by means of protrusions) extends through the transport surface 111 to which each of the plurality of rotational bodies 102 is adjacent.

By means of the movably mounted guide device 602, one or more than one workpiece (e.g. flat or round) may be precisely fed to the next transport roller 102, e.g. a comb roller 1502. When a plurality of workpieces are transported simultaneously, it is thus preferred that each workpiece finds its intended position in the next transport roller 102. Due to the movably mounted guide device 602, the distance between two transport rollers 102 may be selected larger than without the movably mounted guide device 602.

This guide device 602 is configured, for example, to contact the substrate (e.g., a tube) only at its end face portion (illustratively its beginning, e.g., approximately the first 30 millimeters). For example, the substrate is longer than the distance of the support points (e.g., the transport rollers 102) between each other. In that case, only the guide device 602 is in use where the beginning of the substrate is. All other guide devices may be in a waiting position that is protected (e.g., shielded) from the process.

Moving the guide device 602 (also referred to as guide movement), e.g. along the transport direction 101 and/or the movement path 602*p*, may be performed, for example, by means of the drive device 1102 (see FIG. 11), for example, independently of the rotation of the transport rollers 102, the displacement of the WR transport roller 210 and/or the WT transport roller 102. For example, one or more than one sequence (also referred to as guide sequence) may be or may be stored according to which the moving of the guide device 602 may be performed. For example, the one or more than one guide sequence may be stored in a storage medium (e.g., the control device). The control device may actuate the drive device according to the guide sequence.

For example, the drive device 1102 may comprise a third drive train (e.g., comprising a motor and/or transmission) configured to drive the movement of the guide device 602 (also referred to as guide movement). By analogy, what is described for separate drive trains may apply to a drive device 1102 comprising only a motor whose movement is also used to drive the guiding movement by means of a gearbox.

Optionally, the third drive train may be controllable, for example, by controlling a motor of the respective drive train 1102 (e.g., so that its speed may be changed) and/or by controlling the transmission of the respective drive train (e.g., so that its gear ratio may be changed). The transmission may couple the motor to the transport device 100.

The guide sequence may comprise, for example, a first phase in which the guide device 602 is placed in a waiting position and/or is stationary. The guide sequence may comprise, for example, a second phase in which the guide device 602 is accelerated from the waiting position and/or brought up to the transport speed, for example when one or more than one workpiece approaches the guide device 602. For example, the guide sequence may comprise a third phase in which a workpiece is received between two projections of the guide device 602 and the guide device 602 is moved, e.g., at the transport speed and/or in the transport direction 101.

Optionally, the guide sequence (e.g., the start of the second phase and/or third phase) may be controlled and/or regulated, for example based on a sensor that captures the one or more than one workpiece. Optionally, the speed of the guide device 602 may be controlled and/or regulated, for example based on a sensor that captures the transport speed of the workpiece.

In an exemplary implementation, the guide device 602 is arranged between two transport rollers 102 and is moved in such a way that the guide device 602 contacts or guides and optionally supports each workpiece only at its end section. This ensures that each workpiece always reaches its intended position exactly. The track limiters 702 may be designed, for example, as a kind of comb (for tubes). After the end portion of each workpiece has been accurately fed, the guide device 602 is moved to a park position. Optionally, two or more guide devices 602 (also referred to as first guide devices 602 and second guide devices 602) may be or become disposed between two transport rollers 102. Thus, when the first guide device 602 is in the park position, the second guide device 602 is in the waiting position waiting for the next workpieces.

In the case of two guide devices 602, for example, the guide sequence may comprise the third phase in which the first guide device 602 is moved (e.g., displaced) toward the parking position when a workpiece is received between two projections of the first guide device 602 and, simultaneously therewith, the second guide device 602 is moved (e.g., displaced) toward the waiting position.

Several exemplary implementations of guide device 602 are explained below, to which what is described herein may apply by analogy.

Figure 16A:
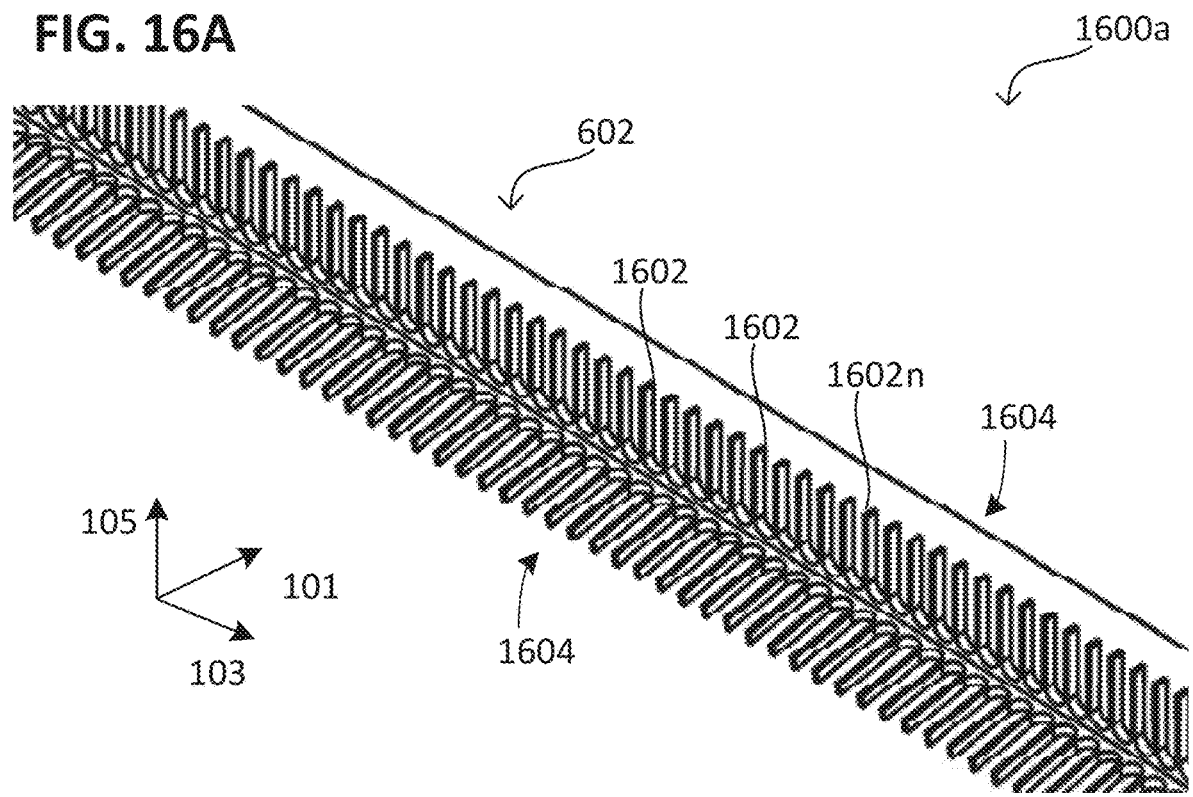

FIG. 16A illustrates a transport device 100 according to various embodiments 1600*a* in a schematic perspective view (looking at the transport surface), in which each track limiter 702 of the guide device 602 is implemented by means of a rod-shaped projection 1602. The rod-shaped projections 1602 (analogue also referred to as rod tines 1602) may, for example, be arranged in a comb-like manner (then also referred to as rod comb 1604). Two directly adjacent rod tines 1602 may each define a workpiece receiving recess 1602n disposed between the two rod tines 1602.

Optionally, the guide device 602 according to embodiments 1600a may comprise two rod combs 1604 that are arranged (e.g., their protrusions) at an angle to each other and/or extended away from each other, e.g., arranged in an L-shape (also referred to as an L-comb). This facilitates the transfer of the workpieces between the guide device 602 and the subsequent transport roller 102, which is, for example, a comb roller.

Figure 16B:
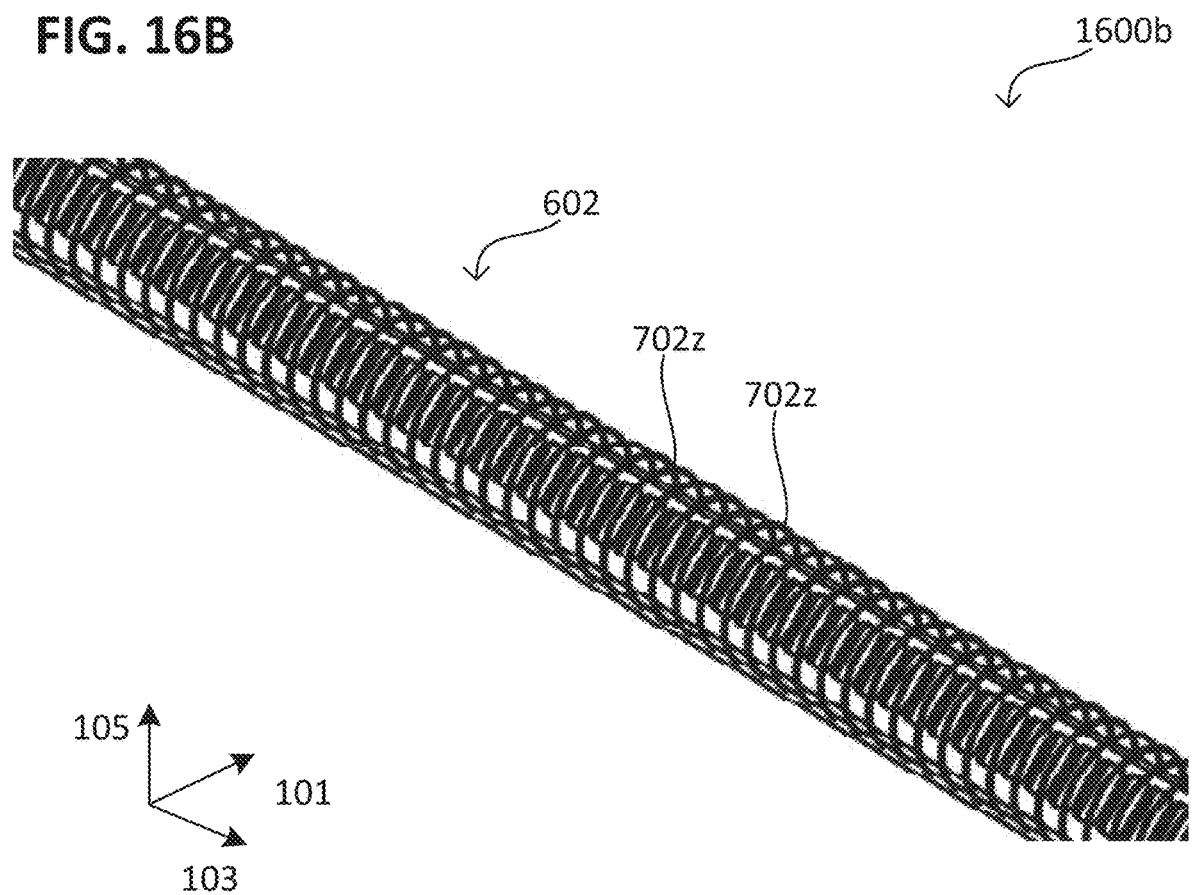

FIG. 16B illustrates a transport device 100 according to various embodiments 1600b (e.g., configured according to any of embodiments 100 to 1000 or 1500) in a schematic perspective view (looking at the transport surface), in which each track limiter 702 of the guide device 602 is implemented by means of a disc-shaped protrusion 702z (analogue also referred to as disc tines 702z). The disc-shaped protrusions 702z may, for example, be arranged in a comb-like manner (then also referred to as disc comb).

Figure 17A:
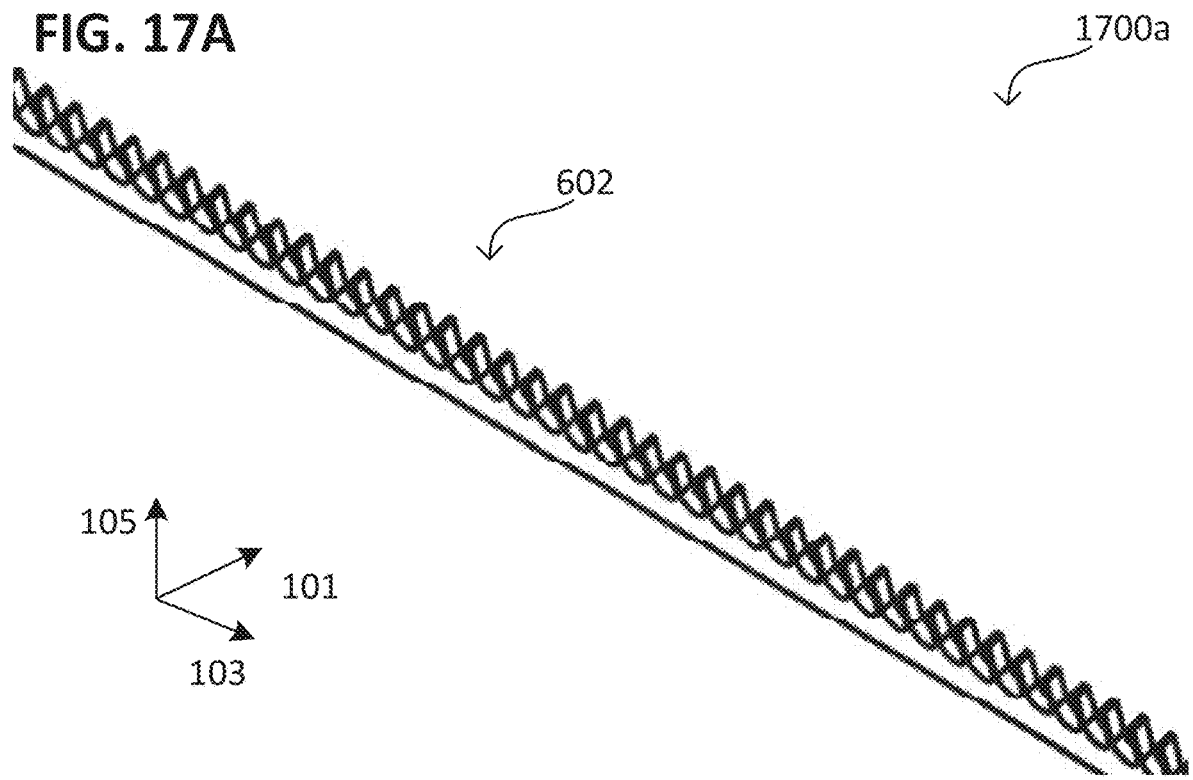

FIG. 17A illustrates a transport device 100 according to various embodiments 1700a (e.g., configured according to any of embodiments 100 to 1000 or 1500) in a schematic perspective view (looking at the transport surface), in which each track limiter 702 of the guide device 602 is implemented by means of a projection that tapers in a direction 105 transverse to the transport plane 111. To this end, the track limiter 702 (or its tapered protrusion 1602) may be, for example, prism-shaped (e.g., analogue to a triangular prism), cone-shaped, or pyramid-shaped. This provides that the surfaces bounding the workpiece-receiving recess are oblique to each other, and thus promotes that the workpieces are more reliably received into the workpiece-receiving recess, reducing the susceptibility to interference.

Figure 17B:
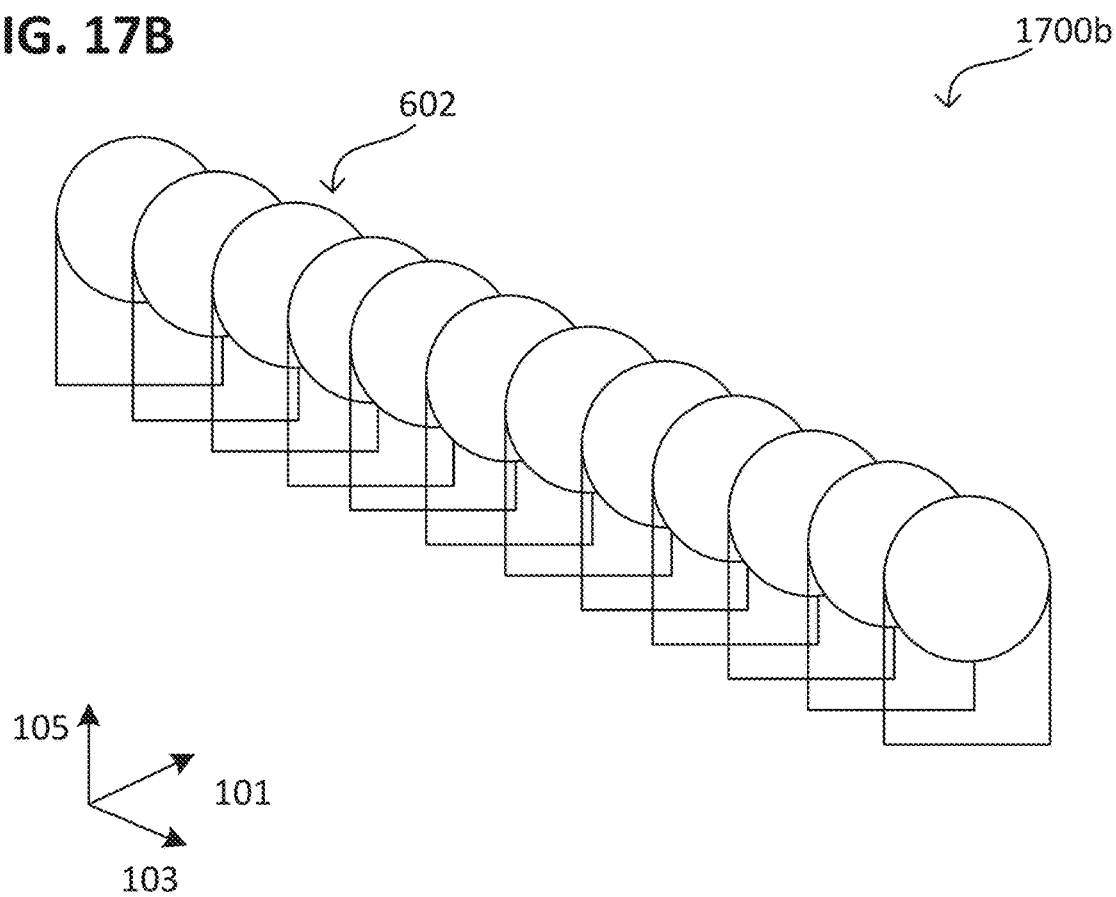

FIG. 17B illustrates a transport device 100 according to various embodiments 1700b (e.g. configured according to one of embodiments 100 to 1000 or 1500) in a schematic perspective view (looking at the transport surface), in which each track limiter 702 of the guide device 602 is implemented by means of a rotatably attached ball 702k. The rotatably attached balls 702k provide a particularly gentle transport (at least with low abrasion) of the workpieces, for example protecting their surface or coating.

In the following, a bearing device is explained by way of example, by means of which the guide device 602 may be or is moveably mounted.

FIG. 18 illustrates a transport device 100 according to various embodiments 1800 (e.g., configured according to any of embodiments 100 to 1000 or 1500 to 1700b) in a schematic perspective view (looking at the transport surface), in which the transport device 100 further comprises the bearing device 1802. The bearing device 1802 may comprise one or more than one bearing members, such as two bearing members, between which the guide device 602 is disposed. Two bearing members provide stable movement to the guide device 602, for example.

Each bearing member may comprise one or more bearings, e.g. pivot bearings and/or translational bearings, by means of which the movable bearing is provided, e.g. by means of which at least one translational degree of freedom is provided to the guide device 602. For example, each bearing member may comprise a movably mounted carriage to which the guide device 602 is attached.

For example, each bearing member may comprise a tension member 1802z (e.g., configured as an endless conveyor) to which the guide device 602 or at least the carriage is attached. Examples of the tension member 1802z comprise: a belt, a strap, a belt, a chain, a rope. For example, the upper run of the traction member extends along the guide portion of the path 602p.

Each bearing member may, for example, comprise a rail 1802s by means of which the guide device 602 or at least the carriage is guided. A rectilinear section of the rail 1802s provides, for example, the guide section of the path 602p.

For example, the traction member 1802z or at least the carriage may be coupled to the drive device 1102, which is configured to supply mechanical energy (also referred to as kinetic energy) to the traction member 1802z or the carriage.

At the position where the tension member is deflected or the rail 1802s changes to the curved path, the guide device 602 may optionally be rotated, e.g. by 180°. This facilitates the delivery or pickup of the workpieces. If an L-comb is used, it prevents the workpieces from leaving their track.

In the following, various examples are described that relate to what has been described above and what is shown in the figures.

Example 1 is a transport device comprising: a plurality of rotational bodies (e.g., transport rollers), each rotational body (e.g., transport roller) being rotatably configured for transporting (e.g., moving) a rod-shaped workpiece (e.g., along a transport direction); at least one rotational excitation element configured to (e.g., mechanically) excite rotation of the workpiece when resting on one or more rotational bodies of the plurality of rotational bodies (e.g., transport rollers); and at least one rotational excitation element configured to (e.g., mechanically) excite rotation of the workpiece when resting on one or more rotational bodies of the plurality of rotational bodies (e.g., transport rollers). at least one rotation exciting member adapted to excite (e.g., mechanically) rotation of the workpiece (also referred to as workpiece rotation) when it is supported on one or more than one rotational body of the plurality of rotational bodies, wherein, for example, the rotation is about an axis that is along the transport direction.

Example 2 is the transport device according to Example 1, wherein, of the plurality of rotational bodies (e.g., transport rollers), each rotational body is rotatably configured around a rotational axis; wherein the rotational excitation element is moveably configured (e.g., supported) along a direction of the rotational axis.

Example 3 is the transport device according to example 1 or 2, wherein the rotational excitation element contacts the workpiece when the workpiece rests on the one or more rotational bodies.

Example 4 is the transport device according to any of Examples 1 to 3, wherein each rotational body of the plurality of rotational bodies comprises a transport roller (e.g., cylindrical roller).

Example 5 is the transport device according to any one of examples 1 to 4, further comprising: a rotational excitation device comprising the rotational excitation element.

Example 6 is the transport device according to any one of examples 1 to 5, further comprising: a bearing device by means of which the rotational excitation element is movably supported, wherein for example the bearing device provides the rotational excitation element with one or more than one degree of freedom (e.g. a first translational degree of freedom, a second translational degree of freedom and/or a rotational degree of freedom), e.g. the first translational degree of freedom and/or the second translational degree of freedom being transverse to the transport direction, e.g. the first translational degree of freedom being along a rotational axis of the rotational bodies, e.g. the second translational degree of freedom being transverse to the rotational axis of the rotational bodies, e.g. the rotational degree of freedom being along the rotational axis of the rotational bodies and/or along the first translational degree of freedom.

Example 7 is the transport device according to example 6, wherein the bearing device comprises a rotational bearing by means of which the rotational excitation element is rotatably (e.g. according to the translational degree of freedom) mounted; and/or wherein the bearing device comprises a translational bearing by means of which the rotational excitation element is moveably (e.g. according to the first translational degree of freedom) mounted.

Example 8 is the transport device according to any of Examples 1 to 7, wherein the rotational excitation element comprises one or more than one additional rotational body, for example, the additional rotational body comprising or being formed from a transport roller (e.g., cylindrical roller or threaded roller).

Example 9 is the transport device according to any of Examples 1 to 8, wherein the rotational excitation element (e.g., the threaded roller) comprises one or more than one (e.g., singly or multiply circumferential) groove for receiving the workpiece.

Example 10 is the transport device according to Example 9, wherein the groove (e.g., multiply circumferential groove) is extended along a helix.

Example 11 is the transport device according to any of Examples 1 to 10, wherein the rotational excitation element comprises a cylindrical rotational body.

Example 12 is the transport device according to any of Examples 1 to 11, wherein the rotational excitation element is configured to press the workpiece against the one or more than one rotational body.

Example 13 is the transport device according to any one of Examples 1 to 12, wherein the plurality of rotational bodies comprises more than one rotational body per rotational excitation element.

Example 14 is the transport device according to any of Examples 1 to 13, wherein a translational degree of freedom is provided to the workpiece by means of the plurality of rotational bodies.

Example 15 is the transport device according to any one of examples 1 to 14, wherein the or each rotational body of the plurality of rotational bodies is configured to perform a rotational motion; and/or wherein the rotational excitation element is configured to perform a movement other than the rotational motion (e.g., along a self-contained path or along a rectilinear segment).

Example 16 is the transport device according to any one of Examples 1 to 15, further comprising: a plurality of track limiters extending through a transport surface to which each of the plurality of rotational bodies and optionally the rotational excitation element is adjacent.

Example 17 is the transport device according to example 16, a, preferably comb-shaped, guide device comprising a plurality of track limiters (e.g. protrusions) for receiving the workpiece between two of the plurality of track limiters; wherein the guide device is arranged between two rotational bodies of the plurality of rotational bodies (e.g. of which at least one rotational body is configured as a comb roller) and is moveably (e.g. so as to provide a translational degree of freedom thereto) supported at least in sections along (e.g. in and/or opposite) a direction (also referred to as a transport direction) of transporting the rod-shaped workpiece, preferably along a self-contained path, for example such that each of the plurality of projections extends through a transport surface to which each of the plurality of rotational bodies is adjacent when the guide device is moved in the transport direction, wherein the transport direction is preferably transverse to an axis of rotation of the two rotational bodies and/or parallel to the transport surface (which is, for example, parallel to the axis of rotation), preferably wherein the workpiece is freely suspended by means of the guide device.

Example 18 is the transport device according to example 16 or 17, wherein the track limiters are configured to block or at least limit movement of the workpiece along an axis of rotation of the rotational bodies; and/or wherein one rotational body of the plurality of rotational bodies comprises the plurality of track limiters or a plurality of additional track limiters (e.g., when configured as a comb roller).

Example 19 is the transport device according to any of examples 16 to 18, wherein each track limiter comprises one or more than one ball or at least one tine.

Example 20 is the transport device according to any one of examples 16 to 19, wherein each of the track limiters (or the track-limiting device) is disposed at a distance from a rotational body of the plurality of rotational bodies that is less than twice a distance of the (e.g., immediately adjacent) track limiters between each other.

Example 21 is the transport device according to any of examples 16 to 20, wherein each of the track limiters (or the track-limiting device) is arranged at a distance from the rotational excitation element that is less than twice a distance of the (e.g., immediately adjacent) track limiters between each other.

Example 22 is the transport device according to any one of examples 16 to 21, further comprising: a track-limiting device comprising the plurality of track limiters and arranged and/or movably supported separately from the plurality of rotational bodies and/or from the rotational excitation element.

Example 23 is the transport device according to example 22, wherein the track-limiting device comprises a roller table comprising a plurality of balls (e.g., as track limiters).

Example 24 is the transport device according to example 22 or 23, wherein the tracking device is arranged directly opposite (e.g., below or above) one rotational body of the plurality of rotational bodies such that a gap (e.g., slot-shaped) is formed therebetween, the gap extending, for example, along the transport surface and/or the transport direction therebetween.

Example 25 is the transport device according to any of examples 22 to 24, wherein the track-limiting device is arranged directly opposite (e.g., below or above) the rotational excitation element such that a gap (e.g., slot-shaped) is formed therebetween, the gap extending, for example, along the transport surface and/or the transport direction therebetween.

Example 26 is the transport device according to any of Examples 1 to 25, wherein the plurality of rotational bodies are adjacent to a transport surface (e.g., extending along the transport direction) along which, for example, the workpiece is transported or which extends along the transport direction.

Example 27 is the transport device of Example 26, wherein the rotational excitation element is movably supported toward or away from the transport surface; and/or wherein the one or more than one rotational body is movably supported toward or away from the transport surface.

Example 28 is a transport system comprising the transport device according to any one of examples 1 to 27, and a drive device configured to: provide one motion (e.g. first rotational motion) and deliver it to the plurality of rotational bodies (e.g. so as to cause them to rotate); and provide a second motion (e.g. second rotational motion) and deliver it to the rotational excitation element (e.g. so as to cause it to excite rotation of the workpiece); and optionally a third motion (e.g. so that it excites the rotation of the workpiece); and optionally a third movement (e.g. translational movement) and supplying it to the moveably supported guide device (e.g. so that it is set into a translational movement, e.g. along the path and/or the transport direction); wherein, for example, the second movement is transferred into a rotational motion of the workpiece by means of the rotational excitation element; wherein, for example, the translational movement of the guide device comprises the speed at which the transport of the rod-shaped workpiece takes place; wherein preferably the workpiece is guided in a freely suspended manner by means of the guide device.

Example 29 is the transport system of example 28, wherein the drive device: comprises one or more than one motor for providing the first movement and the second movement and the optional third movement; and/or comprises one or more than one sensor by means of which the third movement is controlled and/or regulated; wherein, for example, the sensor is configured to measure the transportation of a rod-shaped workpiece.

Example 30 is a vacuum arrangement comprising the transport device according to any one of Examples 1 to 28, and a vacuum chamber in which the plurality of rotational bodies of the transport device and/or the rotational excitation element are arranged.

Example 31 is the vacuum arrangement according to example 30, further comprising: a coating device (e.g. comprising a magnetron) arranged between two rotational bodies of the transport device, wherein preferably between the two rotational bodies of the transport device the workpiece is transported freely suspended and/or the workpiece has no contact in the process or coating area (e.g. is transported contactless over the coating device). For example, the workpieces (also referred to as substrates), e.g. comprising tubes, are not touched at any time in the coating area of the coating device.

Example 32 is a method (e.g. for operating the transport device according to one of examples 1 to 31), comprising: controlling a first actuator (e.g. of a drive device), by means of which a first movement or corresponding first kinetic energy is supplied to a plurality of rotational bodies of a transport device (e.g. according to one of examples 1 to 31) in such a way that the plurality of rotational bodies of the transport device are set into a rotational motion around a rotational axis; controlling a second actuator (e.g., of the drive device), by means of which a second motion or corresponding second kinetic energy is supplied to a rotational excitation element of the transport device, such that the rotational excitation element of the transport device is set in motion (also referred to as excitation motion) along a direction, said direction being along the axis of rotation; optionally controlling a third actuator (e.g., of the drive device) by means of which a guide device of the transport device (which is arranged, for example, between two rotational bodies of the plurality of rotational bodies, of which, for example, one or more than one rotational body is configured as a comb roller) is supplied with a third movement or corresponding translational energy in such a way that the guide device of said transport device is set into translation (also referred to as guide movement) along an additional direction (e.g. of transporting said rod-shaped workpiece), said additional direction (e.g. said transport direction) being transverse to said rotational axis and/or directed towards one of said plurality of rotational bodies; wherein preferably said workpiece is guided in a freely suspended manner by means of said guide device.

Example 33 is the method according to example 32, wherein controlling the second actuator is performed according to one of a plurality of stored sequences (e.g., motion sequences) that differ from each other (e.g., in excitation motion), e.g., a duration, amplitude, speed, frequency, and/or direction of the second motion; and/or wherein controlling the third actuator is performed based on a captured workpiece transported by the plurality of rotational bodies and/or captured by a sensor, e.g., its speed and/or position.

Example 34 is a control device configured to perform the method according to example 32 or 33.

Example 35 is a non-transitory storage medium comprising code segments configured, when executed by a processor, to cause the processor to perform the method according to example 32 or 33.

Example 36 is a method for transporting a rod-shaped workpiece, the method comprising: moving the rod-shaped workpiece along a transport direction by means of a plurality of rotational bodies (e.g. set in rotation) on which the workpiece rests; exciting rotation of the workpiece about an axis of rotation which is along the transport direction by means of a rotation exciting device when the workpiece rests on the plurality of rotational bodies, e.g. when, after and/or before the workpiece is moved along the transport direction; optionally guiding the workpiece between two track limiters (between which, for example, the workpiece, e.g. only its end portion, is arranged), wherein the guiding of the workpiece is effected, for example, by means of a guide device comprising the two track limiters, wherein, for example, the two track limiters and the guide device, respectively, are/is displaced in the transport direction and/or are/is moved along a self-contained path; wherein, preferably, the workpiece is guided in a freely suspended manner by means of the guide device.

Example 37 is any one of examples 1 to 36 (e.g., the method according to example 36), wherein the workpiece comprises or is formed from a hollow body; and/or wherein the workpiece is circular-cylindrical in shape; and/or wherein an extent of the workpiece along the transport direction is greater than a distance of immediately adjacent rotational bodies of the plurality of first transport rollers between each other and/or than a distance of the rotational excitation element between the transport roller of the plurality of first transport rollers immediately adjacent thereto.

Example 38 is any of Examples 1 to 37 (e.g., the method according to Example 37), wherein the workpiece is transported in a vacuum.

Example 39 is any of Examples 1 to 38, wherein each rotational body comprises or is formed from a transport roller (e.g., cylindrical roller).

The invention claimed is:

1. A transport device, comprising:
 a plurality of rotational bodies for transporting a rod-shaped workpiece, wherein each rotational body is rotatable;
 a rotational excitation element configured to excite rotation of the workpiece when the workpiece is supported on at least one rotational body of the plurality of rotational bodies; and
 a bearing device by means of which the rotational excitation element is movably mounted, wherein the bearing device comprises a translational bearing by means of which the rotational excitation element is moveably mounted.

2. The transport device according to claim 1,
wherein each rotational body of the plurality of rotational bodies is rotatable about an axis of rotation;
wherein the rotational excitation element is moveable along a direction of the axis of rotation.

3. The transport device according to claim 1, wherein the rotational excitation element contacts the workpiece when the workpiece rests on the at least one of the plurality of rotational bodies.

4. The transport device according to claim 1, wherein the rotational excitation element comprises a cylindrical additional rotational body.

5. The transport device according to claim 1, wherein the rotational excitation element comprises a groove for receiving the workpiece.

6. The transport device according to claim 5, wherein the groove extends along a helix.

7. The transport device according to claim 1, wherein the rotational excitation element is configured to press the workpiece against the at least one rotational body of the plurality of rotational bodies.

8. The transport device according to claim 1, further comprising: a plurality of track limiters extending through a transport surface to which each of the plurality of rotational bodies is adjacent.

9. The transport device of claim 8, wherein the plurality of track limiters are configured to limit movement of the workpiece along an axis of rotation of the plurality of rotational bodies.

10. The transport device according to claim 8, wherein each track limiter comprises at least one ball.

11. The transport device according to claim 8, wherein each of the track limiters is disposed at a distance from a corresponding rotational body of the plurality of rotational bodies that is less than twice a distance of the track limiters between each other.

12. The transport device according to claim 8, wherein each of the track limiters is disposed at a distance from the rotational excitation element that is less than twice a distance of the track limiters between each other.

13. The transport device according to claim 8, wherein the plurality of rotational bodies are adjacent the transport surface, wherein the rotational excitation element is movably supported to be movable towards or away from the transport surface.

14. The transport device according to claim 1, further comprising:
a guide device comprising a plurality of track limiters for receiving the workpiece between two of the plurality of track limiters;
wherein the guide device:
is arranged between two rotational bodies of the plurality of rotational bodies, and
is moveably supported at least sectionally along a direction of transport of the rod-shaped workpiece such that each of the plurality of track limiters is extended through a transport surface to which each of the plurality of rotational bodies is adjacent when the guide device is moved in the direction of transport of the rod-shaped workpiece.

15. A vacuum assembly, comprising:
the transport device according to claim 1; and
a vacuum chamber in which the plurality of rotational bodies of the transport device are disposed.

16. The vacuum assembly according to claim 15, further comprising:
a coating device arranged between two rotational bodies of the transport device;
wherein the workpiece is configured to be transported freely suspended between the two rotational bodies of the transport device.

17. A method of operating a transport device, the method comprising:
controlling a first actuator by means of which kinetic energy is supplied to a plurality of rotational bodies of the transport device in such a way that the plurality of rotational bodies are set into a rotational motion about a rotational axis; and
controlling a second actuator by means of which kinetic energy is supplied to a rotational excitation element of the transport device such that the rotational excitation element is set in a motion along a direction, the direction being along the rotational axis.

18. The method of claim 17, wherein controlling the second actuator is in accordance with one of a plurality of stored sequences that differ from one another with respect to the motion.

19. The method of claim 17, the method further comprising:
moving a rod-shaped workpiece along a transport direction by means of the rotational motion of the plurality of rotational bodies on which the workpiece rests; and
exciting rotation of the workpiece about an axis of rotation, which is along the transport direction, by means of the motion of the rotational excitation element when the workpiece rests on the plurality of rotational bodies.

20. A transport device, comprising:
a plurality of rotational bodies for transporting a rod-shaped workpiece, wherein each rotational body is rotatable;
a rotational excitation element configured to excite rotation of the workpiece when the workpiece is supported on at least one rotational body of the plurality of rotational bodies; and
a plurality of track limiters extending through a transport surface to which each of the plurality of rotational bodies is adjacent.

21. A transport device, comprising:
a plurality of rotational bodies for transporting a rod-shaped workpiece, wherein each rotational body is rotatable;
a rotational excitation element configured to excite rotation of the workpiece when the workpiece is supported on at least one rotational body of the plurality of rotational bodies;
a guide device comprising a plurality of track limiters for receiving the workpiece between two of the plurality of track limiters, wherein the guide device:
is arranged between two rotational bodies of the plurality of rotational bodies; and
is moveably supported at least sectionally along a direction of transport of the rod-shaped workpiece such that each of the plurality of track limiters is extended through a transport surface to which each of the plurality of rotational bodies is adjacent when the guide device is moved in the direction of transport of the rod-shaped workpiece.

* * * * *